(12) United States Patent
Kim et al.

(10) Patent No.: US 9,318,494 B2
(45) Date of Patent: Apr. 19, 2016

(54) METHODS OF FORMING POSITIONED LANDING PADS AND SEMICONDUCTOR DEVICES INCLUDING THE SAME

(71) Applicant: Samsung Electronics Co., Ltd., Suwon-si (KR)

(72) Inventors: Kyung-Eun Kim, Seoul (KR); Dae-Ik Kim, Hwaseong-si (KR); Young-Seung Cho, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/692,789

(22) Filed: Apr. 22, 2015

(65) Prior Publication Data
US 2016/0020213 A1    Jan. 21, 2016

(30) Foreign Application Priority Data
Jul. 18, 2014    (KR) .......................... 10-2014-0090725

(51) Int. Cl.
| H01L 27/10 | (2006.01) |
| H01L 27/108 | (2006.01) |
| H01L 21/02 | (2006.01) |
| H01L 21/768 | (2006.01) |
| H01L 21/311 | (2006.01) |

(52) U.S. Cl.
CPC ...... *H01L 27/10885* (2013.01); *H01L 21/0217* (2013.01); *H01L 21/02164* (2013.01); *H01L 21/31144* (2013.01); *H01L 21/76877* (2013.01); *H01L 27/10852* (2013.01); *H01L 27/10873* (2013.01); *H01L 27/10888* (2013.01)

(58) Field of Classification Search
CPC .................................................. H01L 21/764
See application file for complete search history.

(56) References Cited

U.S. PATENT DOCUMENTS

| 6,777,341 | B2 | 8/2004 | Shin et al. |
| 7,056,786 | B2 | 6/2006 | Yun et al. |
| 7,183,603 | B2 | 2/2007 | Park |
| 7,361,454 | B2 | 4/2008 | Kobayashi |
| 7,968,447 | B2 | 6/2011 | Lee et al. |
| 8,008,698 | B2 | 8/2011 | Lee et al. |
| 8,445,379 | B2 | 5/2013 | Park et al. |
| 9,041,122 | B2 * | 5/2015 | Yoo ..................... H01L 23/5225 257/384 |
| 9,214,382 | B2 * | 12/2015 | Lee ........................ H01L 21/764 |
| 2004/0188806 | A1 * | 9/2004 | Chung .............. H01L 21/76829 257/621 |

(Continued)

FOREIGN PATENT DOCUMENTS

| JP | 2013-143484 | 7/2013 |
| KR | 10-2004-0078413 | 9/2004 |
| KR | 10-2011-0087604 | 8/2011 |

*Primary Examiner* — Jerome Jackson, Jr.
*Assistant Examiner* — Ankush Singal
(74) *Attorney, Agent, or Firm* — Myers Bigel & Sibley, P.A.

(57) ABSTRACT

A method of forming a DRAM can include forming a plurality of transistors arranged in a first direction on a substrate and forming a bit line structure that extends in the first direction, where the bit line structure being electrically coupled to the plurality of transistors at respective locations in the first direction. A plurality of first landing pads an be formed at alternating ones of the respective locations having a first position in a second direction on the substrate. A plurality of second landing pads can be formed at intervening ones of the respective locations between the alternating ones of the respective locations, where the intervening ones of the respective locations having a second position in the second direction on the substrate wherein second position is shifted in the second direction relative to the first position.

14 Claims, 44 Drawing Sheets

(56) References Cited

U.S. PATENT DOCUMENTS

| | | | | |
|---|---|---|---|---|
| 2011/0223731 A1* | 9/2011 | Chung | H01L 27/0207 | 438/270 |
| 2012/0168899 A1* | 7/2012 | Kim | H01L 21/7682 | 257/522 |
| 2012/0208364 A1* | 8/2012 | Rouh | H01L 21/31144 | 438/666 |
| 2012/0276711 A1* | 11/2012 | Yoon | H01L 21/764 | 438/421 |
| 2013/0320549 A1* | 12/2013 | Lee | H01L 23/4821 | 257/773 |
| 2013/0320550 A1* | 12/2013 | Kim | H01L 21/76897 | 257/773 |
| 2014/0027924 A1* | 1/2014 | Lee | H01L 21/48 | 257/774 |
| 2014/0077333 A1* | 3/2014 | Son | H01L 21/7682 | 257/522 |
| 2014/0175659 A1* | 6/2014 | Lee | H01L 21/76831 | 257/773 |
| 2014/0187037 A1* | 7/2014 | Rho | H01L 29/92 | 438/626 |
| 2014/0306351 A1* | 10/2014 | Kim | H01L 21/76855 | 257/774 |
| 2015/0061154 A1* | 3/2015 | Choi | H01L 27/10855 | 257/774 |
| 2015/0099344 A1* | 4/2015 | Kim | H01L 21/76224 | 438/424 |
| 2015/0228754 A1* | 8/2015 | Sung | H01L 29/6656 | 438/595 |

* cited by examiner

1ST DIRECTION
2ND DIRECTION

1ST DIRECTION
2ND DIRECTION

FIG. 36
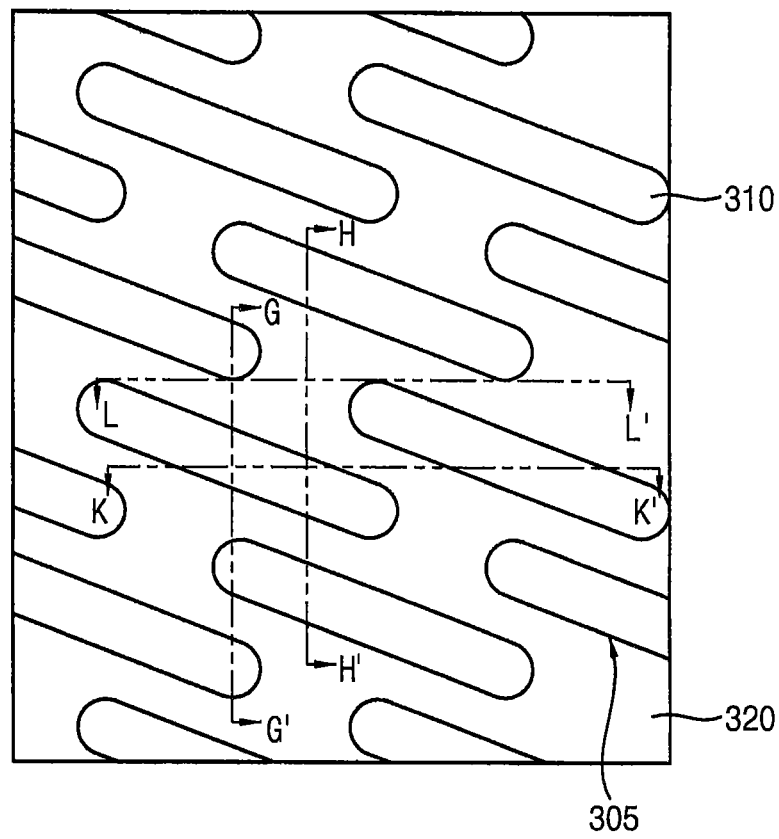
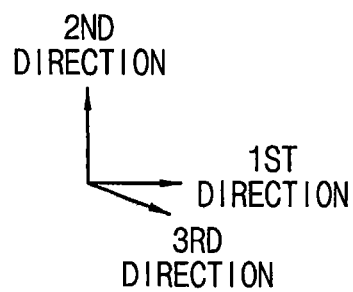

2ND DIRECTION
1ST DIRECTION
3RD DIRECTION

FIG. 47
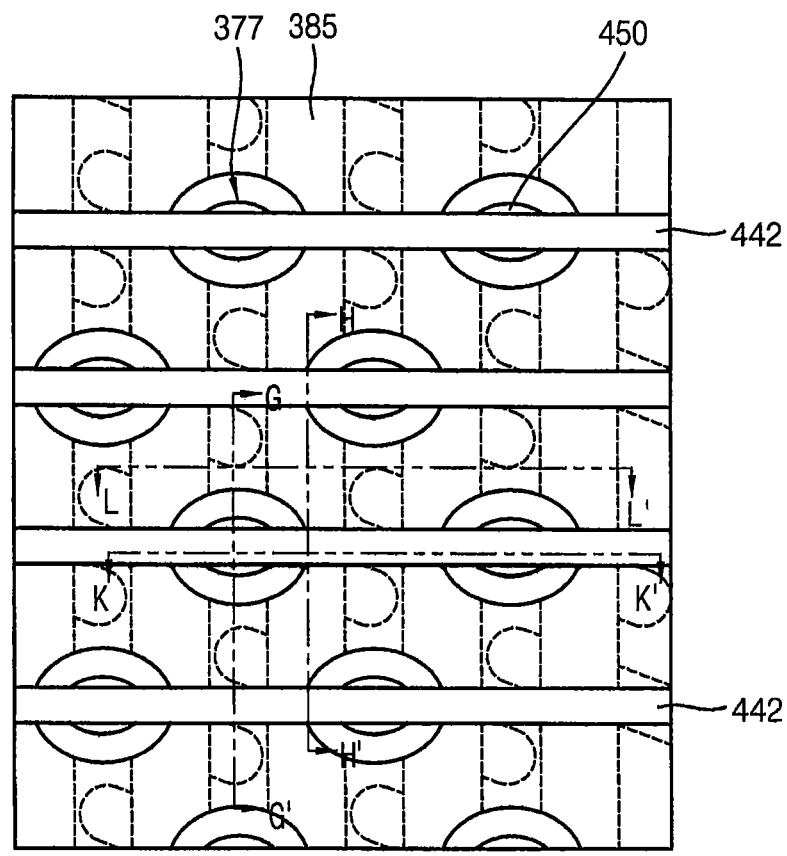
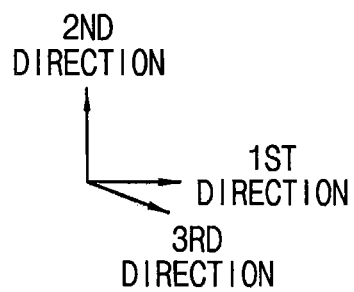

FIG. 49
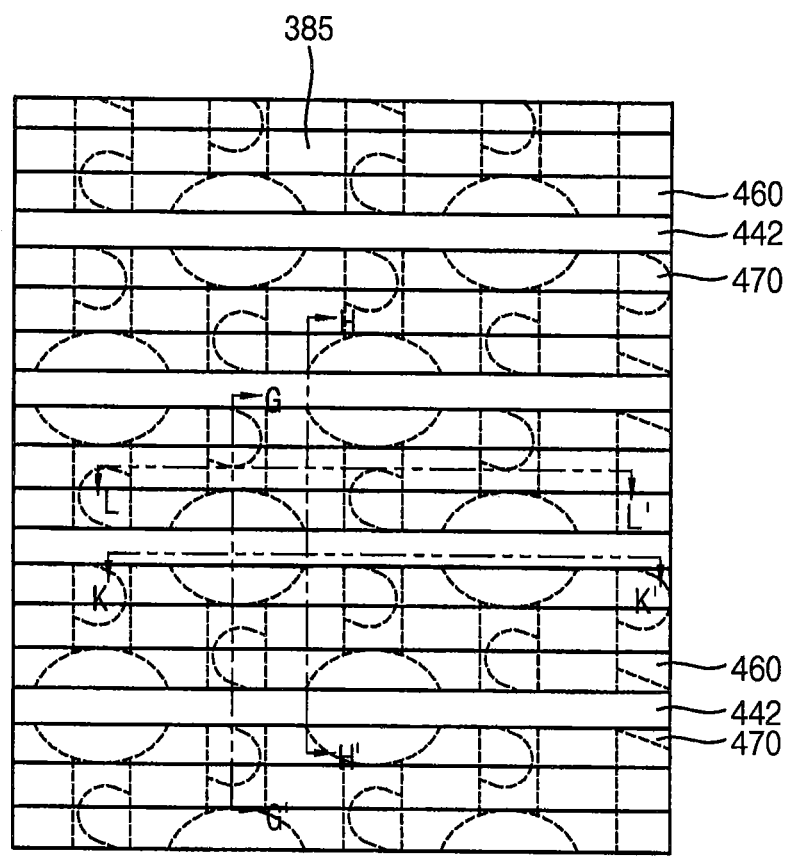
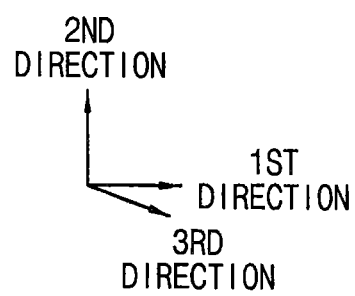

FIG. 52
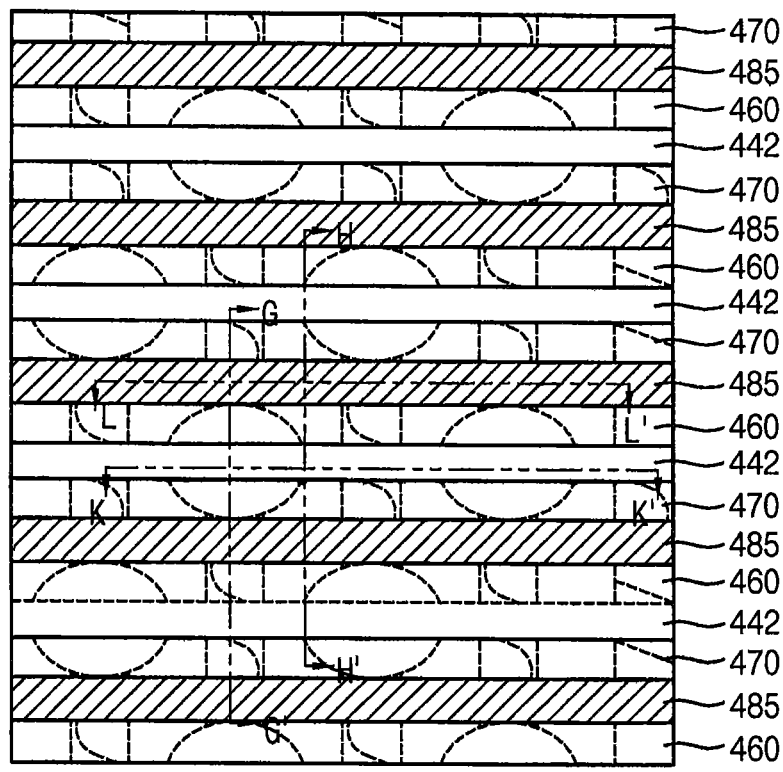
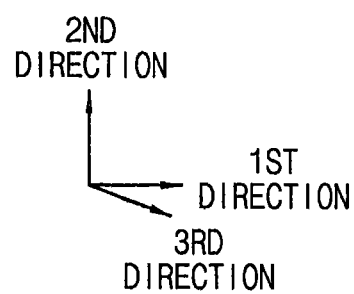

FIG. 58
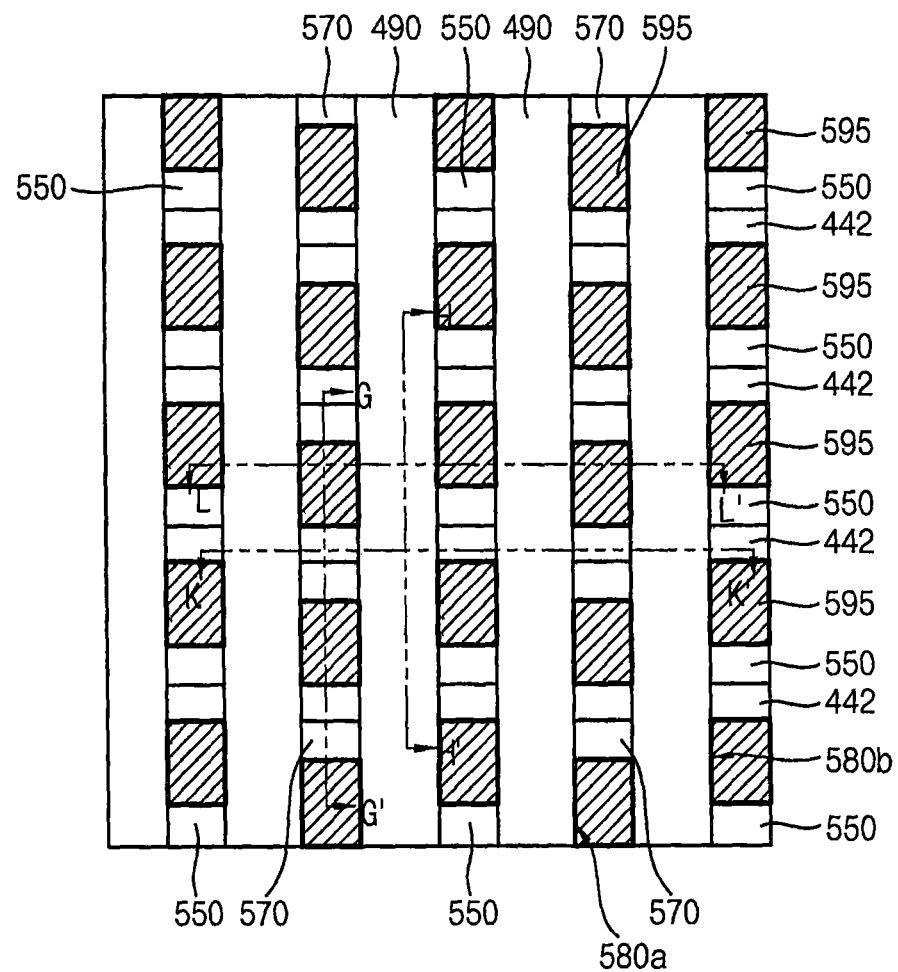
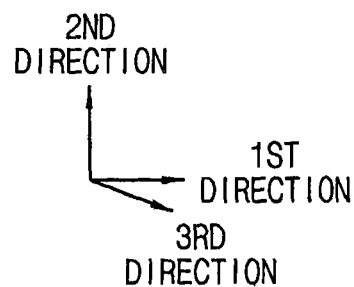

METHODS OF FORMING POSITIONED LANDING PADS AND SEMICONDUCTOR DEVICES INCLUDING THE SAME

CROSS-REFERENCE TO RELATED APPLICATION

This application claims priority under 35, USC §119 to Korean Patent Application No. 10-2014-0090725, filed on Jul. 18, 2014 in the Korean Intellectual Property Office (KIPO), the entire contents of which are incorporated herein by reference.

FIELD

Example embodiments generally relate to semiconductor devices and methods of manufacturing semiconductor devices. More particularly, example embodiments relate to landing pads for storage electrode contacts and methods of manufacturing semiconductor devices using the same.

BACKGROUND

Storage electrodes of capacitors in a DRAM may be formed in a honeycomb arrangement which may be mis-aligned to underlying contact plugs. Thus, a landing pad may be formed between the contact plug and the storage electrode, to address the potential mis-alignment.

SUMMARY

Embodiments according to the inventive concept can include methods of forming positioned landing pads and semiconductor devices including the same. Pursuant to these embodiments, a method of forming a DRAM can include forming a plurality of transistors arranged in a first direction on a substrate and forming a bit line structure that extends in the first direction, where the bit line structure being electrically coupled to the plurality of transistors at respective locations in the first direction. A plurality of first landing pads an be formed at alternating ones of the respective locations having a first position in a second direction on the substrate. A plurality of second landing pads can be formed at intervening ones of the respective locations between the alternating ones of the respective locations, where the intervening ones of the respective locations having a second position in the second direction on the substrate wherein second position is shifted in the second direction relative to the first position.

In some embodiments according to the inventive concept, the first and second positions can define a wave pattern in the first direction. In some embodiments according to the inventive concept, forming a plurality of first landing pads can include forming removing first spacers from a first side of the bit line structure and maintaining second spacers on a second side of the bit line structure opposite the first side at the alternating ones of the respective locations.

In some embodiments according to the inventive concept, forming a plurality of second landing pads can include removing the second spacers from the second side of the bit line structure and maintaining the first spacers on the first side of the bit line structure at the intervening ones of the respective locations. In some embodiments according to the inventive concept, the first and second spacers can include respective materials having an etch selectivity relative to one another.

In some embodiments according to the inventive concept, a method of forming patterns can include forming first lines on a substrate, each of the first lines extending in a first direction. First and second spacers can be formed on respective opposing sidewalls of each of the first lines. Second lines can be formed between respective ones of the first lines, each of the second lines extending in the first direction. Division lines can be formed through at least upper portions of the first and second lines and the first and second spacers to divide an upper portion of each of the first spacers into a plurality of first spacer patterns disposed in the first direction, and divide an upper portion of each of the second spacers into a plurality of second spacer patterns disposed in the first direction, each of the division lines extending in a second direction substantially perpendicular to the first direction. Ones of the first and second spacer patterns can be replaced in a zigzag pattern with third and fourth spacer patterns, respectively. Upper portions of the first and second spacer patterns not replaced with the third and fourth spacer patterns can be removed and upper portions of the second lines adjacent thereto to form first trenches. Patterns can be formed to fill the first trenches.

In some embodiments according to the inventive concept, the first and second spacers include silicon oxide, and the third and fourth spacer patterns include silicon nitride. In some embodiments according to the inventive concept, each of the first lines includes a first conductive layer pattern, a second conductive layer pattern and a hard mask sequentially stacked on the substrate, and each of the second lines includes a conductive material.

In some embodiments according to the inventive concept, the first conductive layer pattern and the second lines each include doped polysilicon, and the second conductive layer pattern includes a metal. In some embodiments according to the inventive concept, forming division lines through at least upper portions of the first and second lines and the first and second spacers can include forming each of the division lines through the hard mask of each of the first lines and the second lines to form an upper portion of the first lines to include a plurality of hard mask patterns disposed in the first direction, and to form a plurality of second line patterns disposed in the first direction.

In some embodiments according to the inventive concept, the patterns in the first trenches can be formed in a wave pattern in the first direction. In some embodiments according to the inventive concept, replacing ones of the first and second spacer patterns in a zigzag pattern with the third and fourth spacer patterns, respectively can include replacing upper portions of the ones of the first and second spacer patterns with the third and fourth spacer patterns, respectively. In some embodiments according to the inventive concept, replacing the upper portions of the ones of the first and second spacer patterns with the third and fourth spacer patterns, respectively can include forming first masks to cover the first lines and the first spacer patterns, etching upper portions of the second spacer patterns using the first masks as an etching mask to form second trenches, and forming fifth spacer patterns to fill the second trenches, respectively.

In some embodiments according to the inventive concept, the fifth spacer patterns can include a material having a high etching selectivity with respect to the first spacer patterns. In some embodiments according to the inventive concept, each of the fifth spacer patterns can include a SOH layer pattern and a PE-SiON layer pattern sequentially stacked. In some embodiments according to the inventive concept, each of the first masks extends in the first direction.

In some embodiments according to the inventive concept, after forming the fifth spacer patterns, the method can further include forming second masks to cover the first spacer patterns in an odd-numbered row in the first direction, etching the upper portions of the first spacer patterns using the second masks as an etching mask to form third trenches, and forming the third spacer patterns to fill the third trenches, respectively.

In some embodiments according to the inventive concept, each of the second masks can be formed to extend and cover the first spacer patterns in the odd-numbered row, and cover portions of the first lines, the fifth spacer patterns, and portions of the second lines that are adjacent to the first spacer patterns in the odd-numbered row in the second direction. In some embodiments according to the inventive concept, forming first and second spacers on respective opposing sidewalls of each of the first lines can include performing an exposure process using KrF, ArF, EUV or X-ray.

In some embodiments according to the inventive concept, a method of manufacturing a semiconductor device can include forming bit line structures in a first direction on a substrate. First and second spacers can be formed on respective opposing sidewalls of each of the bit line structures. Contact lines can be formed between respective one of the bit line structures, each of the contact lines extending in the first direction. Division lines can be formed through at least upper portions of the bit line structures and the first and second spacers and the contact lines to divide an upper portion of each of the first spacers into a plurality of first spacer patterns disposed in the first direction, divide an upper portion of each of the second spacers into a plurality of second spacer patterns disposed in the first direction, and divide each of the contact lines into a plurality of contacts disposed in the first direction, each of the division lines extending in a second direction substantially perpendicular to the first direction. Ones of the first and second spacer patterns can be replaced in a zigzag pattern with third and fourth spacer patterns, respectively. Upper portions of the first and second spacer patterns not replaced with the third and fourth spacer patterns can be replaced and upper portions of the contact lines adjacent thereto to form trenches. Landing pads can be formed to fill the trenches and capacitors can be formed to contact each of the landing pads.

BRIEF DESCRIPTION OF THE DRAWINGS

Example embodiments will be more clearly understood from the following detailed description taken in conjunction with the accompanying drawings.

FIGS. 1 to 35 are plan views and cross-sectional views illustrating methods of forming patterns in accordance with some embodiments; and FIGS. 36, 38, 41, 45, 47, 49, 52, 54, 56, 57, 58 and 60 are plan views illustrating intermediate structures formed as part of methods of manufacturing semiconductor devices in accordance with some embodiments, and FIGS. 37, 39, 40, 42-44, 46, 48, 50, 51, 53, 55, 59 and 61 are cross-sectional views illustrating intermediate structures formed as part of methods of manufacturing semiconductor devices in accordance with some embodiments.

DETAILED DESCRIPTION

Figure 1:
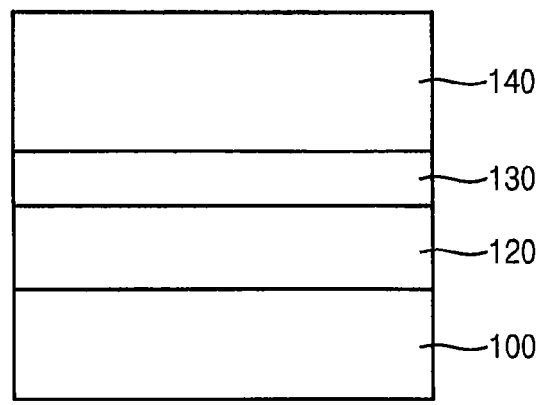
FIGS. 1 to 61 represent non-limiting, embodiments as described herein.

Example embodiments will now be described more fully with reference to the accompanying drawings, in which example embodiments are shown. Example embodiments may, however, be embodied in many different forms and should not be construed as limited to the example embodiments set forth herein. In the drawings, the thicknesses of layers and regions are exaggerated for clarity. Like reference numerals in the drawings denote like elements.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 35 are plan views and cross-sectional views illustrating methods of forming patterns in accordance with example embodiments. FIGS. 3, 5, 7, 10, 12, 14, 16, 18, 20, 22, 24, 26, 28, 30, 32 and 34 are plan views, and FIGS. 1, 2, 4, 6, 8, 9, 11, 13, 15, 17, 19, 21, 23, 25, 27, 29, 31, 33 and 35 are cross-sectional views.

The cross-sectional views may include cross-sections cut along lines A-A', B-B' and C-C' of the corresponding plan views, respectively. The lines A-A', B-B' and C-C' may extend in a second direction substantially parallel to a top surface of a substrate 100.

Referring to FIG. 1, a first conductive layer 120, a second conductive layer 130 and a hard mask layer 140 may be sequentially formed on the substrate 100.

The substrate 100 may be, e.g., a silicon substrate, a germanium substrate, a silicon-germanium substrate, a silicon-on-insulator (SOI) substrate, a germanium-on-insulator (GOI) substrate, etc.

The first and second conductive layers 120 and 130 may be formed to include, e.g., doped polysilicon, a metal, a metal nitride, etc. In example embodiments, the first conductive layer 120 may be formed to include doped polysilicon, the second conductive layer 130 may be formed to include a metal, e.g., tungsten, and the hard mask layer 140 may be formed to include a nitride, e.g., silicon nitride.

Figure 2:
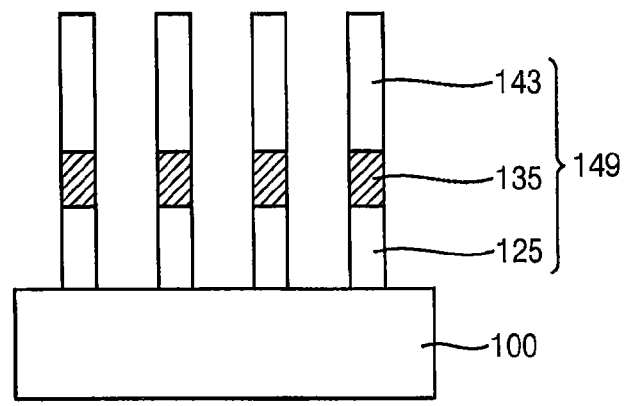

Referring to FIG. 2, the hard mask layer 140, the second conductive layer 130 and the first conductive layer 120 may be sequentially etched to form a first line 149 including a first conductive layer pattern 125, a second conductive layer pattern 135 and a hard mask 143 sequentially stacked on the substrate 100.

In example embodiments, the first line 149 may extend in a first direction substantially parallel to the top surface of the substrate 100 and substantially perpendicular to the second direction, and a plurality of first lines 149 may be formed spaced apart in the second direction.

Figure 3:
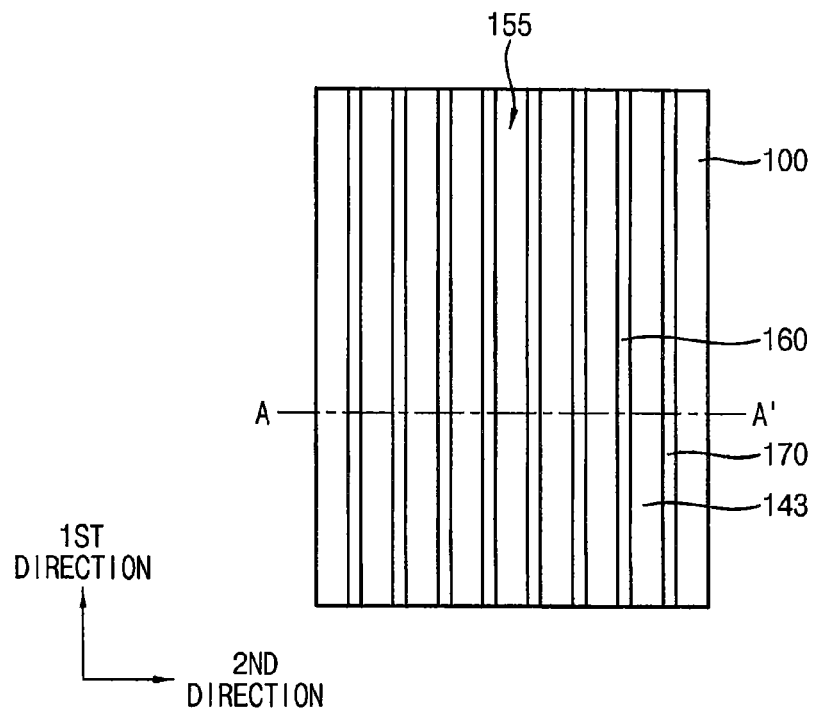
Figure 4:
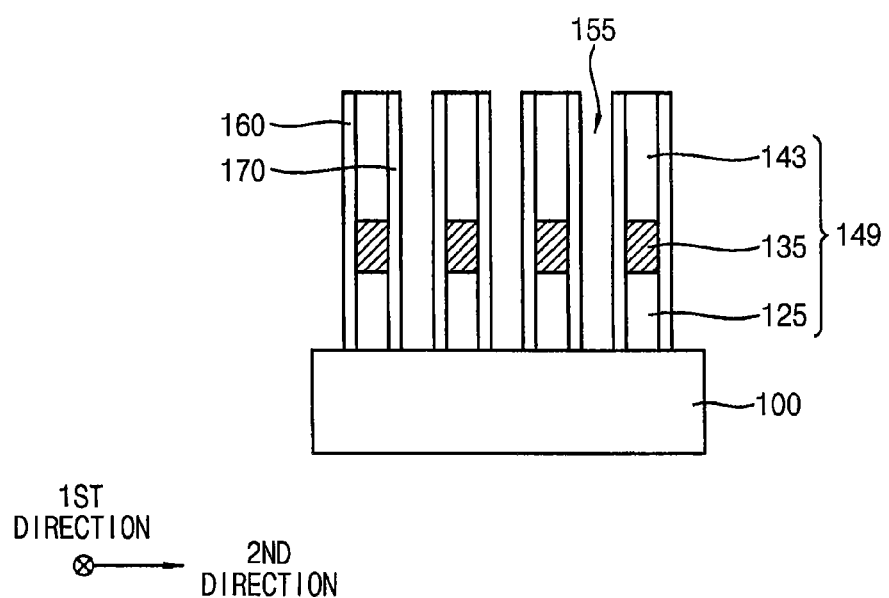

Referring to FIGS. 3 and 4, spacers 160 and 170 may be formed on both sidewalls of each of the first lines 149, respectively.

Particularly, a spacer layer may be formed on the substrate 100 to cover the first lines 149, and the spacer layer may be etched by an exposure process using KrF, ArF, extreme ultra violet (EUV), X-ray, etc., so that the spacers 160 and 170 may be formed on both sidewalls of each of the first lines 149, respectively. The spacer layer may be formed to include an oxide, e.g., silicon oxide. The spacers 160 and 170 may include a first spacer 160 on one sidewall of each of the first lines 149 and a second spacer 170 on the other sidewall of each of the first lines 149.

Accordingly, as the first and second spacers 160 and 170 may be formed on both sidewalls of the first lines 149, an opening 155 may be formed between neighboring first and second spacers 160 and 170.

Figure 5:
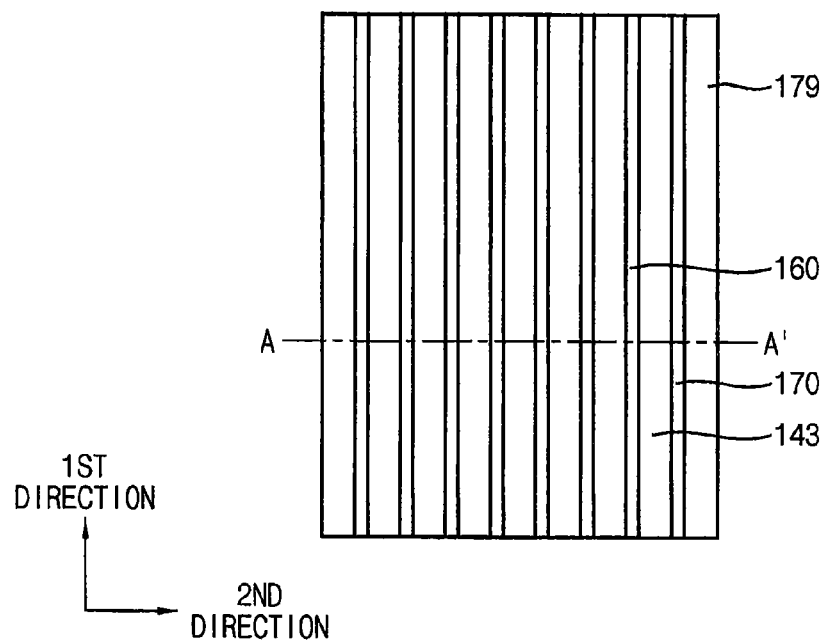
Figure 6:
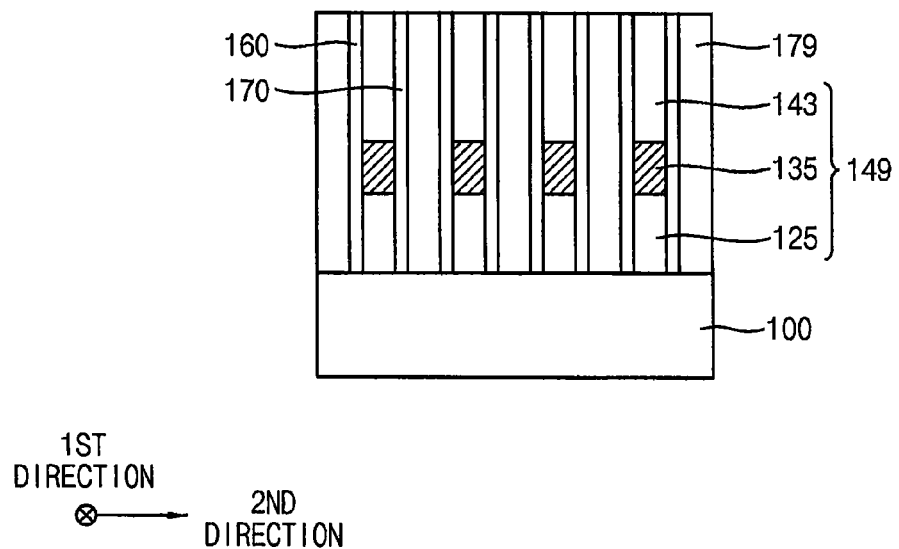

Referring to FIGS. 5 and 6, a second line 179 filling the opening 155 may be formed to extend in the first direction.

Particularly, a third conductive layer may be formed on the substrate 100, the first lines 149, and the first and second spacers 160 and 170 to sufficiently fill the opening 155, and an upper portion of the third conductive layer may be planarized by a chemical mechanical polishing (CMP) process and/or an etch back process so that a plurality of second lines 179 each of which may extend in the first direction may be formed spaced apart in the second direction. The third conductive layer may be formed to include a conductive material, e.g., doped polysilicon, a metal, a metal nitride, a metal silicide, etc.

Figure 7:
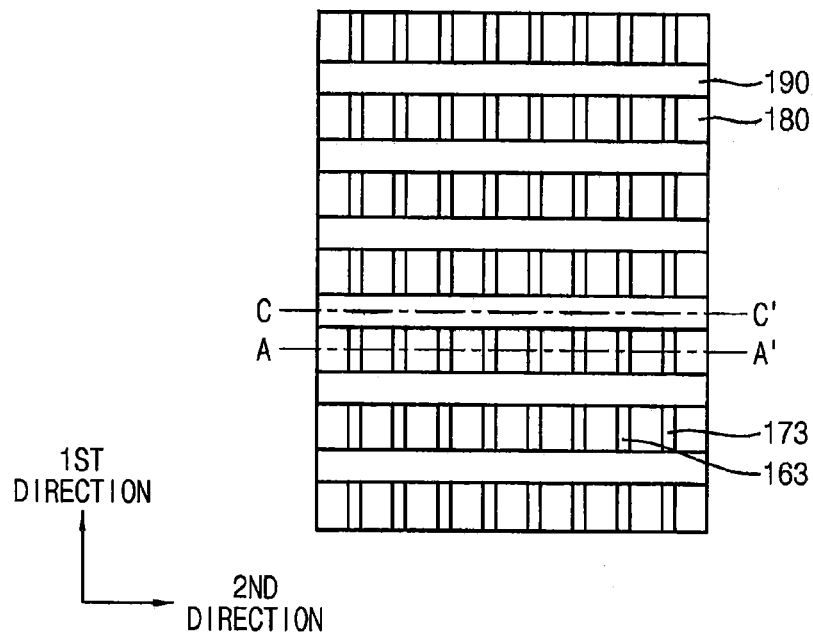
Figure 8:
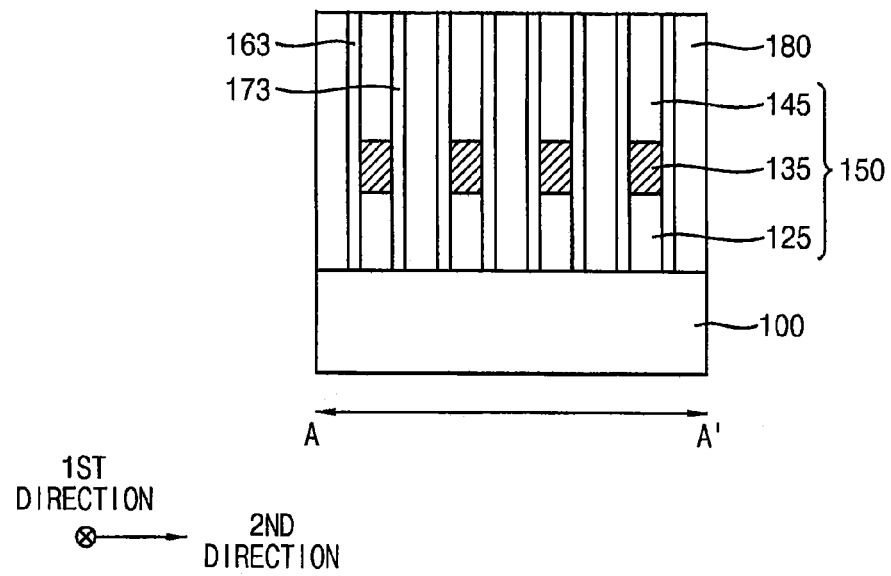
Figure 9:
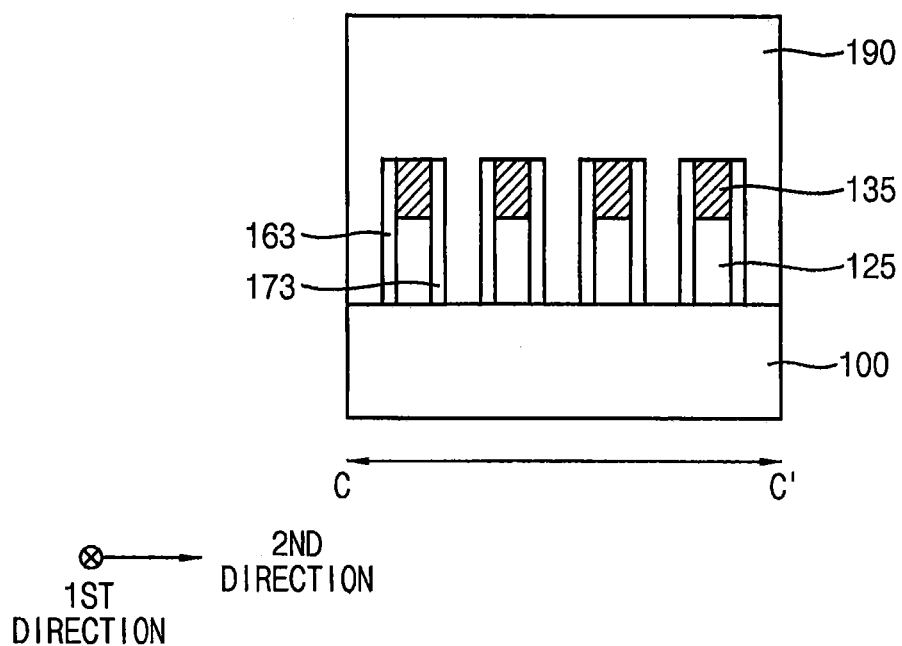

Referring to FIGS. 7 to 9, a plurality of first trenches, each of which may extend in the second direction and penetrate at least upper portions of the first and second lines 149 and 179 and the first and second spacers 160 and 170, may be formed spaced apart in the first direction.

In example embodiments, each of the first trenches may be formed through the hard mask 143 of the first line 149, and upper portions of the first and second spacers 160 and 170, and the second line 179 adjacent to the hard mask 143 in the second direction. Thus, a bottom surface of each first trench may be substantially coplanar with a top surface of the second conductive layer pattern 135 in a region in which the first line 149 is formed, and substantially coplanar with a top surface of the substrate 100 in a region in which the second line 179 is formed.

A division line 190 may be formed to fill each first trench using an insulating material, e.g., silicon nitride. In example embodiments, the division line 190 may extend in the second direction, and a plurality of division lines 190 may be formed spaced apart in the first direction.

As the division line 190 is formed, an upper portion of each of the first spacers 160 extending in the first direction may be divided into a plurality of first spacer patterns 163 in the first direction, and an upper portion of each of the second spacers 170 extending in the first direction may be divided into a plurality of second spacer patterns 173 in the first direction. Thus, the first and second spacer patterns 163 and 173 may define a checkerboard arrangement when viewed in FIG. 7.

An upper portion of each of the first lines 149 extending in the first direction, i.e., the hard mask 143 may be divided into a plurality of hard mask patterns 145 in the first direction, and each of the second lines 179 extending in the first direction may be divided into a plurality of second line patterns 180.

Accordingly, as the hard mask 143 is divided into the plurality of hard mask patterns 145, a plurality of first line patterns 150 each of which may include the first conductive layer pattern 125, the second conductive layer pattern 135 and the hard mask pattern 145 may be defined in the first direction.

Figure 10:
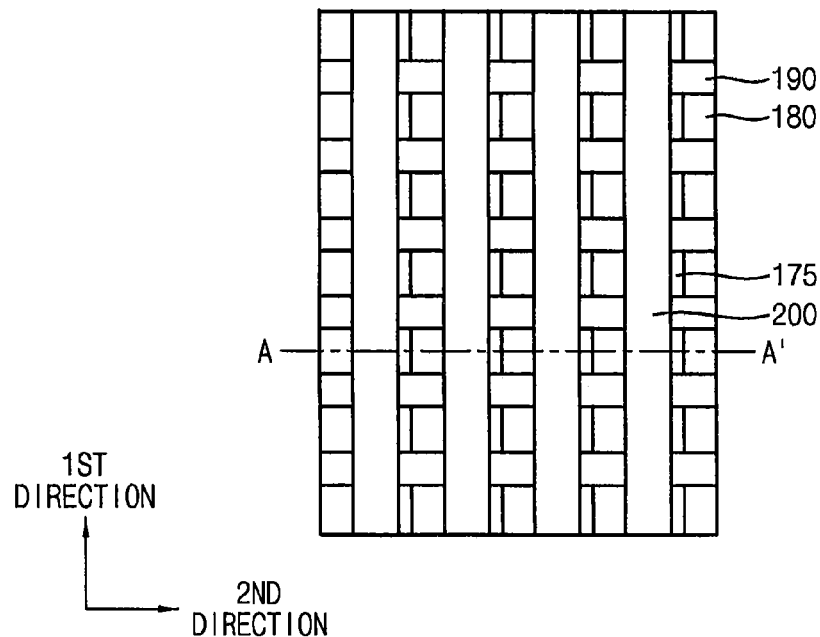
Figure 11:
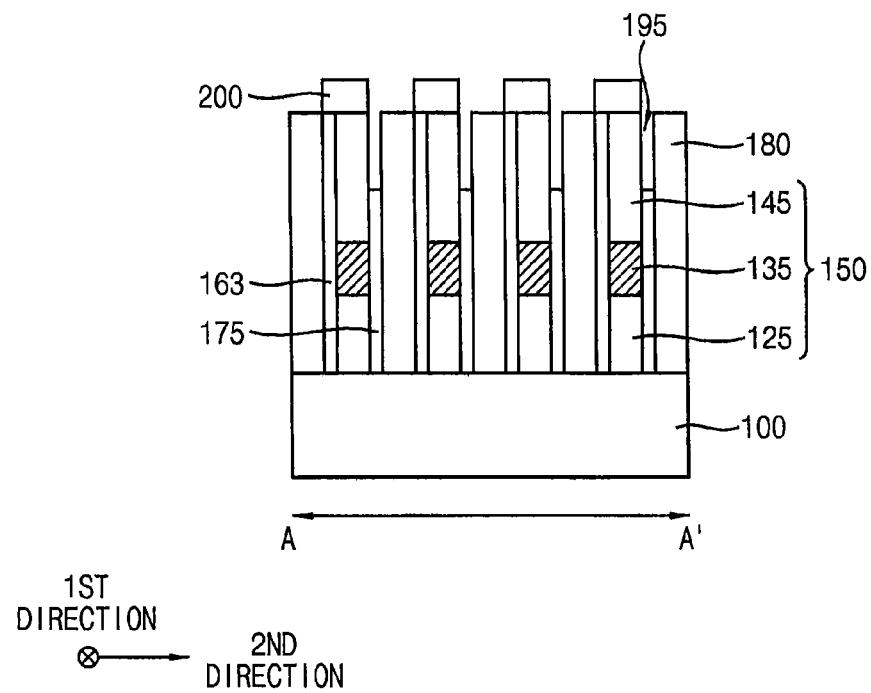

Referring to FIGS. 10 and 11, a first mask 200 covering the first spacer patterns 163 may be formed, and an upper portion of each of the second spacer patterns 173 may be etched using the first mask 200 as an etching mask to form a second trench 195, and thus each of the second spacer patterns 173 may be converted into a third spacer pattern 175.

In example embodiments, the first mask 200 may extend in the first direction, and a plurality of first masks 200 may be formed spaced apart in the second direction. Thus, the first mask 200 may cover not only the first spacer patterns 163 but also the division line 190 adjacent to the first spacer patterns 163 in the first direction. Further, the first mask 200 may cover the first line patterns 150.

Accordingly, as the plurality of second spacer patterns 173 may be formed both in the first and second directions, a plurality of second trenches 195 and a plurality of third spacer patterns 175 may be formed spaced apart in both the first and second directions.

In example embodiments, a bottom surface of the second trench 195 may be formed to be higher than a top surface of the second conductive layer pattern 135, and thus a top surface of the third spacer pattern 175 may be formed to be higher than the top surface of the second conductive layer pattern 135.

The second line pattern 180, a portion of the division line 190 and the hard mask pattern 145 of the first line pattern 150 that may not be covered by the first mask 200 may have etching rates less than that of the second spacer pattern 173 so as not to be etched.

Figure 12:
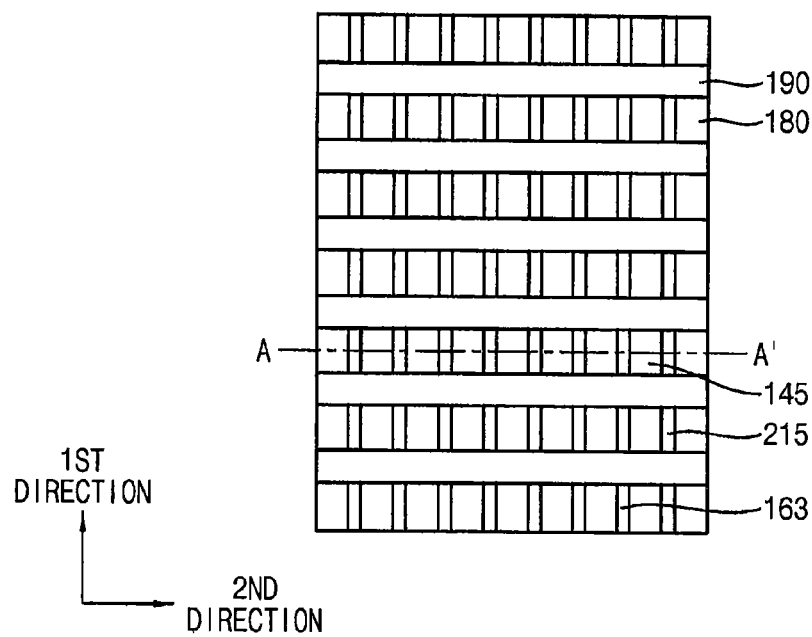
Figure 13:
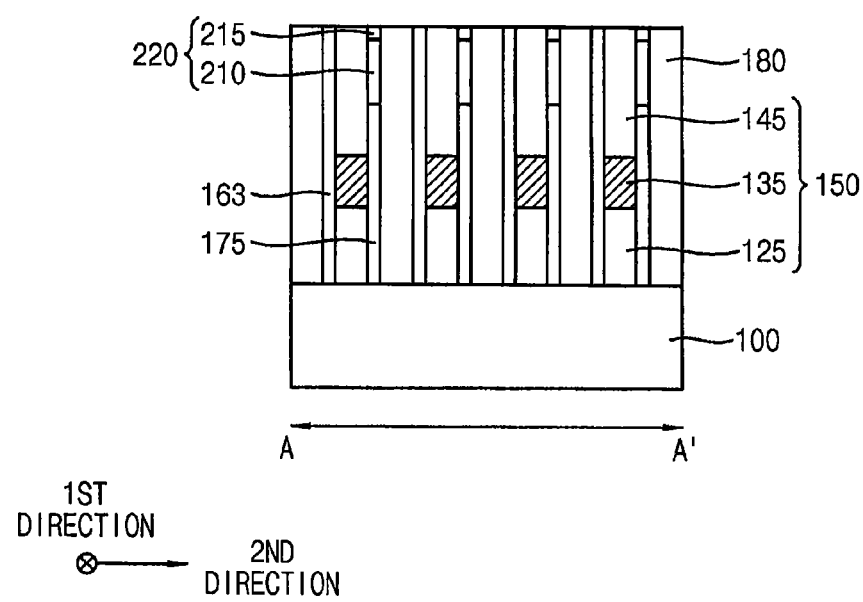

Referring to FIGS. 12 and 13, a fourth spacer pattern 220 may be formed to fill the second trench 195.

Particularly, a first filling layer may be formed on the hard mask patterns 145, the first and third spacer patterns 163 and 175, the second line patterns 180, and the division lines 190 to sufficiently fill the second trenches 195, and may be partially removed by a CMP process and/or an etch back process to form a first filling layer pattern 210 filling a lower portion of each of the second trenches 195. A second filling layer may be formed on the hard mask patterns 145, the first spacer patterns 163, the second line patterns 180, the first filling layer patterns 210 and the division lines 190 to sufficiently fill remaining portions of the second trenches 195, and may be planarized by a CMP process and/or an etch back process until top surfaces of the hard mask patterns 145 may be exposed to form a second filling layer pattern 215. Thus, the fourth spacer pattern 220 including the first and second filling layer patterns 210 and 215 sequentially stacked may be formed.

Accordingly, as the plurality of second trenches 195 may be formed spaced apart in both the first and second directions, a plurality of fourth spacer patterns 220 may be formed spaced apart in both the first and second directions.

In example embodiments, each of the first and second filling layer patterns 210 and 215 may be formed to include a material having a high etching selectivity with respect to the first spacer pattern 163. Additionally, each of the first and second filling layer patterns 210 and 215 may be formed to include a material that may be easily removed by an ashing process and/or a stripping process. Thus, the first and second filling layer patterns 210 and 215 may include, e.g., a spin-on-hardmask (SOH) layer pattern and a plasma enhanced silicon oxynitride (PE-SiON) layer pattern, respectively.

Figure 14:
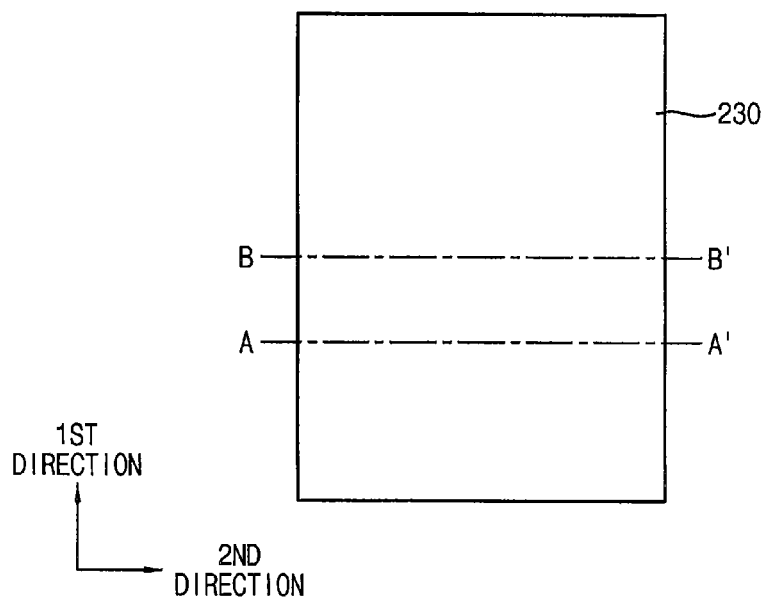
Figure 15:
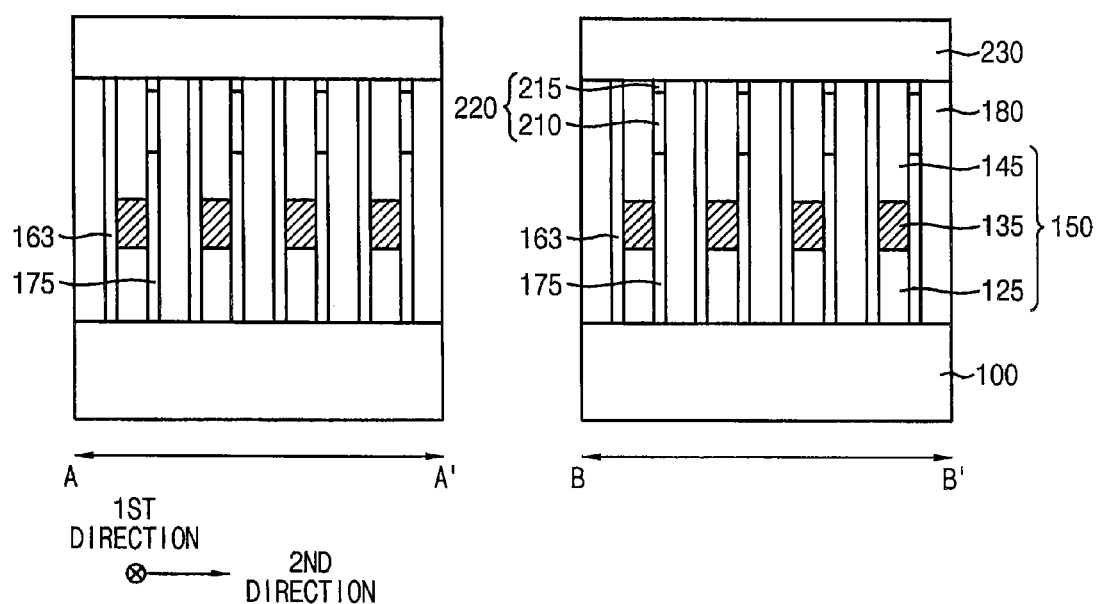

Referring to FIGS. 14 and 15, a second mask layer 230 may be formed on the first line patterns 150, the first spacer patterns 163, the second line patterns 180, the division lines 190 and the fourth spacer patterns 220.

In example embodiments, the second mask layer 230 may be formed to include a material substantially the same as that of the fourth spacer pattern 220. For example, the second mask layer 230 may include a PE-SiON layer.

Figure 16:
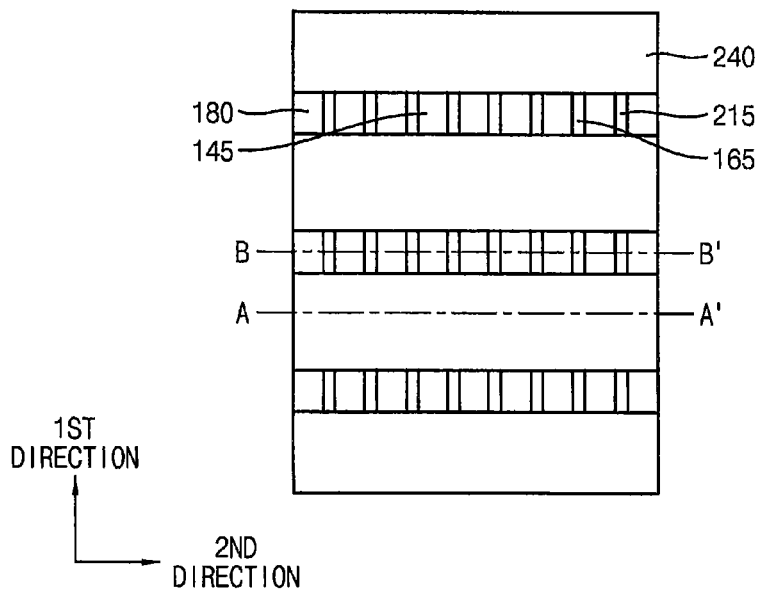
Figure 17:
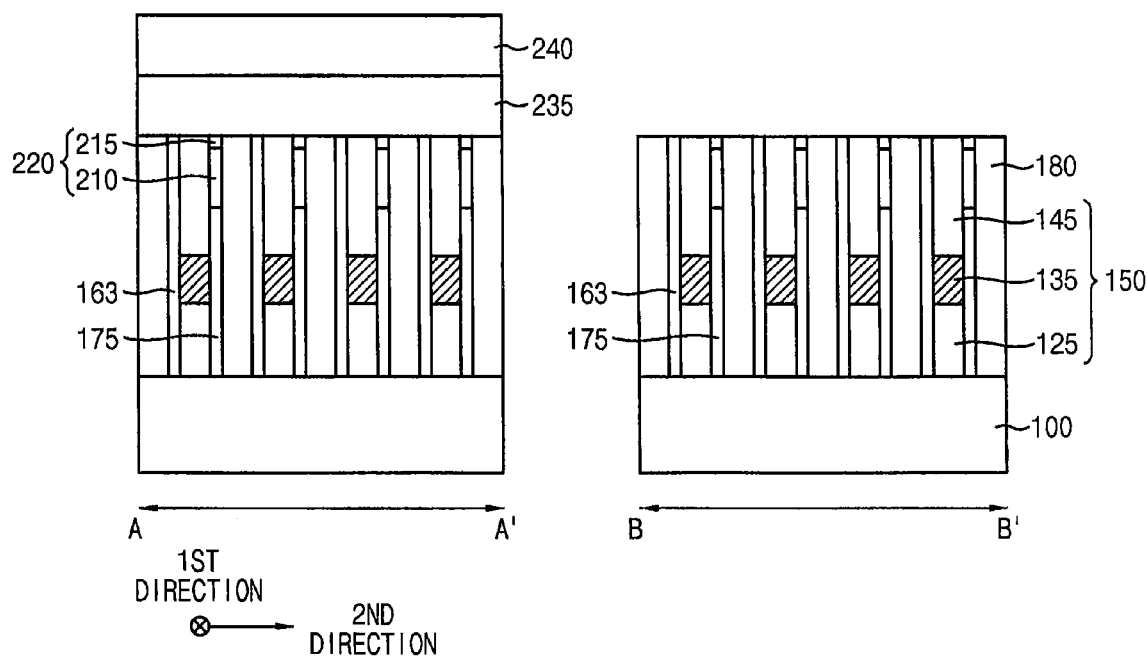

Referring to FIGS. 16 and 17, the second mask layer 230 may be patterned to form a second mask 235 covering some of the first spacer patterns 163 disposed in the first direction, e.g., ones in an odd-numbered row along the first direction.

Particularly, a photoresist pattern 240 partially exposing the second mask layer 230 may be formed thereon, and the second mask layer 230 may be etched using the photoresist pattern 240 as an etching mask to form the second mask 235.

In example embodiments, the second mask 235 may extend in the second direction and cover the first spacer patterns 163 in the odd-numbered rows along the first direction, and portions of the first line patterns 150, the fourth spacer patterns 220 and the second line patterns 180 that may be adjacent to the first spacer patterns 163 in the odd-numbered rows in the second direction. Additionally, the second mask 235 may cover the division lines 190.

Figure 18:
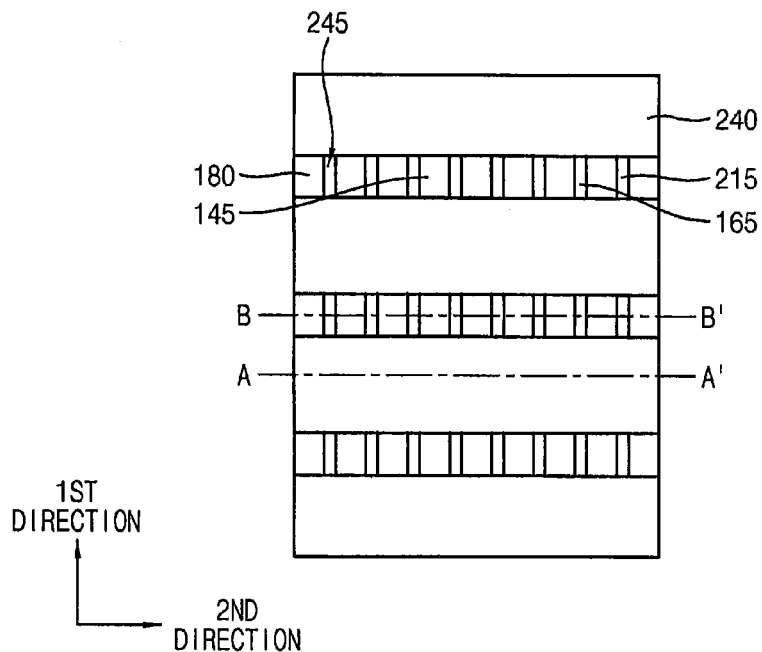
Figure 19:
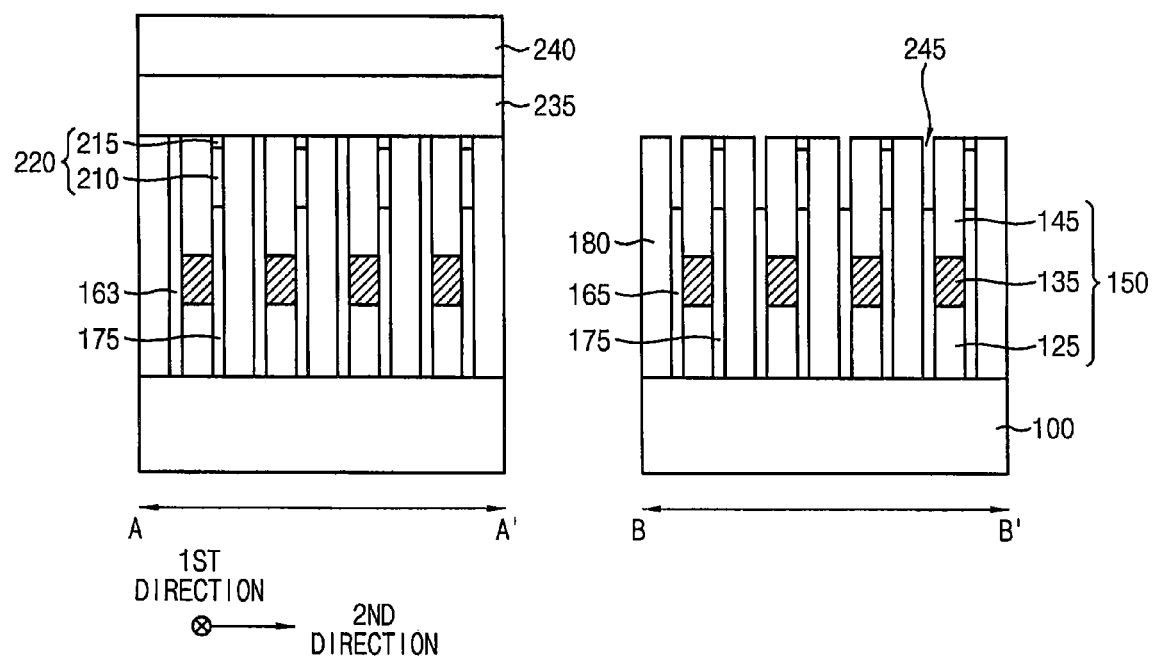

Referring to FIGS. 18 and 19, upper portions of the first spacer patterns 163 in an even-numbered row (i.e., between adjacent odd-numbered rows) along the first direction that may not be covered by the second mask 235 may be etched to form third trenches 245, and each of the first spacer patterns 163 in the even-numbered row may be converted into a fifth spacer pattern 165. Thus, the first spacer patterns 163 and the fifth spacer patterns 165 may be alternately formed in the first direction.

Each of the third trenches 245 may be formed to have a bottom surface higher than a top surface of the second conductive layer pattern 135. In example embodiments, the bottom surface of each of the third trenches 245 may be substantially coplanar with a bottom surface of each of the fourth spacer patterns 220. Accordingly, as the upper portions of the first spacer patterns 163 in the even-numbered row along the first direction may be etched, a plurality of third trenches 245 may be formed both in the first and second directions.

In the etching process, each of the hard mask patterns 145 and the second filling layer patterns 215 may include a material having a high etching selectivity with respect to the first spacer pattern 163, and thus may not be covered by the second mask 235. Only the upper portions of the first spacer patterns 163 not covered by the second mask 235 may be selectively etched.

Figure 20:
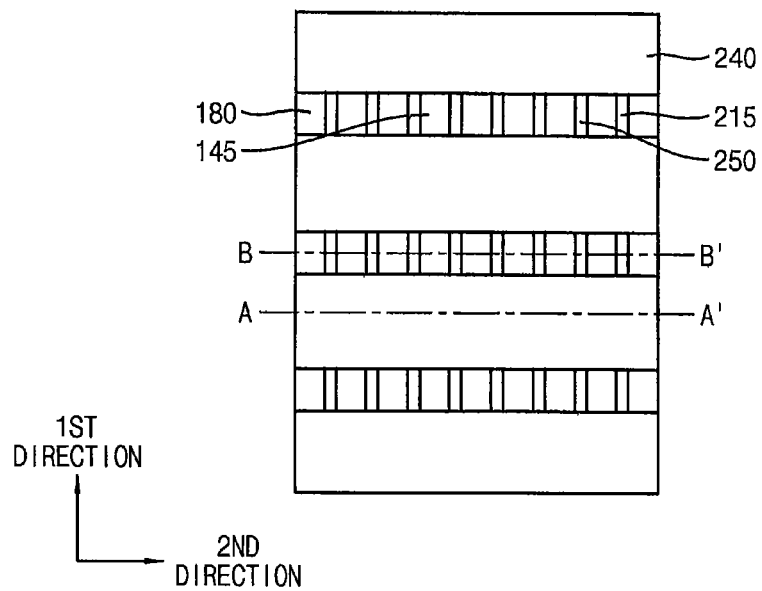
Figure 21:
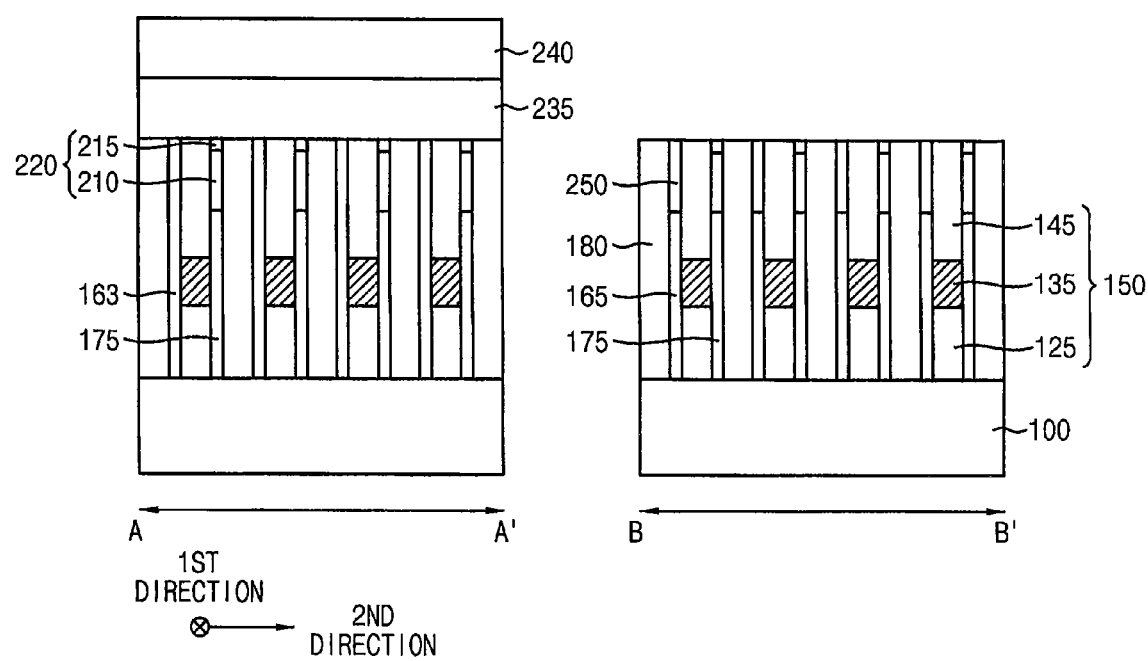

Referring to FIGS. 20 and 21, a sixth spacer layer may be formed on the fifth spacer patterns 165 and portions of the hard mask patterns 145, the second line patterns 180 and the fourth spacer patterns 220 that may be exposed by the second mask 235 to sufficiently fill the third trenches 245, and may be planarized by a CMP process and/or an etch back process until top surfaces of the hard mask patterns 145 may be exposed to form sixth spacer patterns 250.

In example embodiments, the sixth spacer layer may be formed to include a material having a high etching selectivity with respect to silicon oxide, e.g., silicon nitride.

Figure 22:
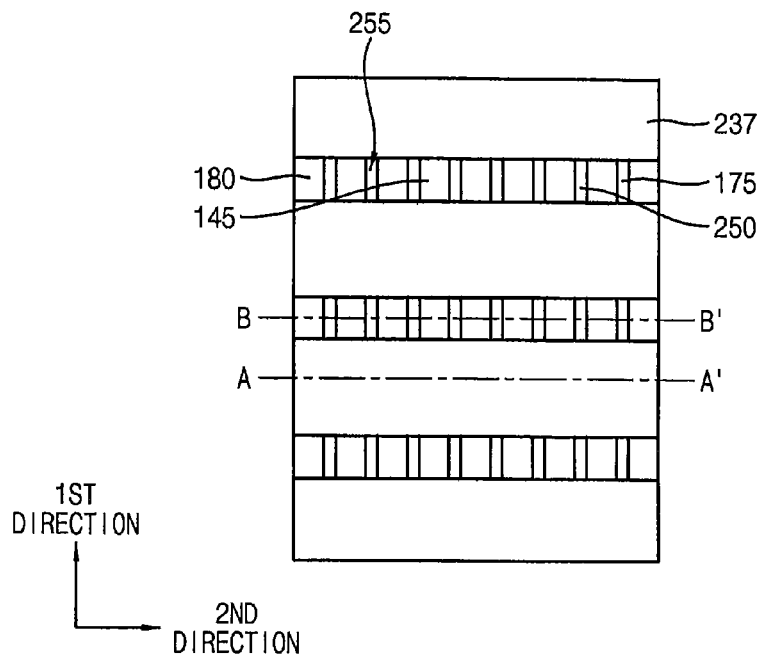
Figure 23:
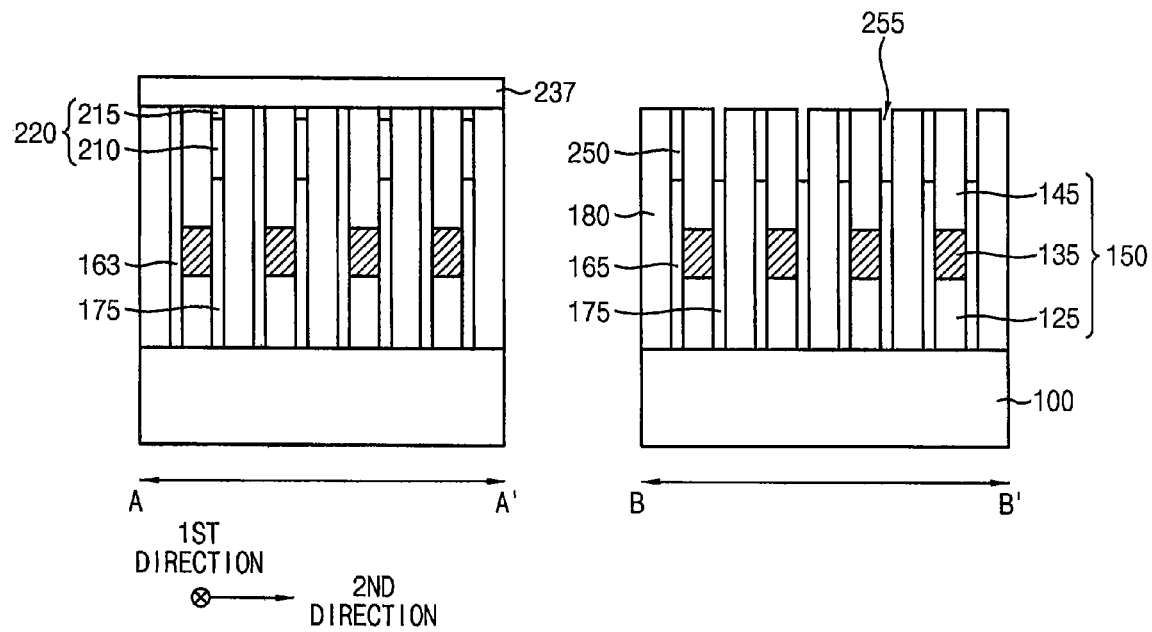

Referring to FIGS. 22 and 23, the fourth spacer patterns 220 not covered by the second mask 235 may be removed.

Particularly, the second filling layer patterns 215 exposed by the second mask 235 may be removed by an ashing process and/or a stripping process to expose the first filling layer patterns 210. The photoresist patterns 240 and upper portions of the second mask 235 may be also removed, and the second mask 235 may be converted into a third mask 237. In example embodiments, the third mask 237 may be planarized by a CMP process and/or an etch back process.

The exposed first filling layer patterns 210 may be removed by an ashing process and/or a stripping process, to form the fourth trenches 255.

Each of the fourth trenches 255 may have a bottom surface higher than a top surface of each of the second conductive layer patterns 135. In example embodiments, the bottom surface of the each of the fourth trenches 255 may be substantially coplanar with a bottom surface of each of the sixth spacer patterns 250.

As the fourth trenches 255 may be formed, top surfaces of the third spacer patterns 175 may be exposed.

Figure 24:
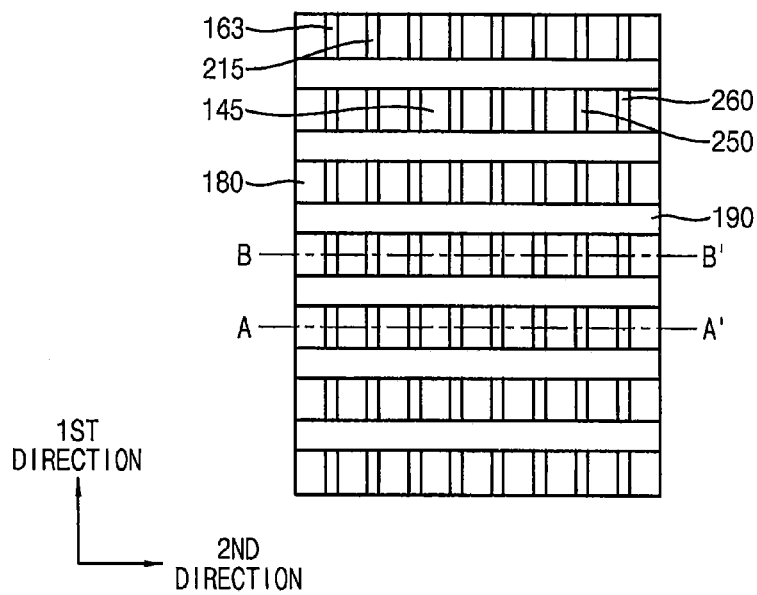
Figure 25:
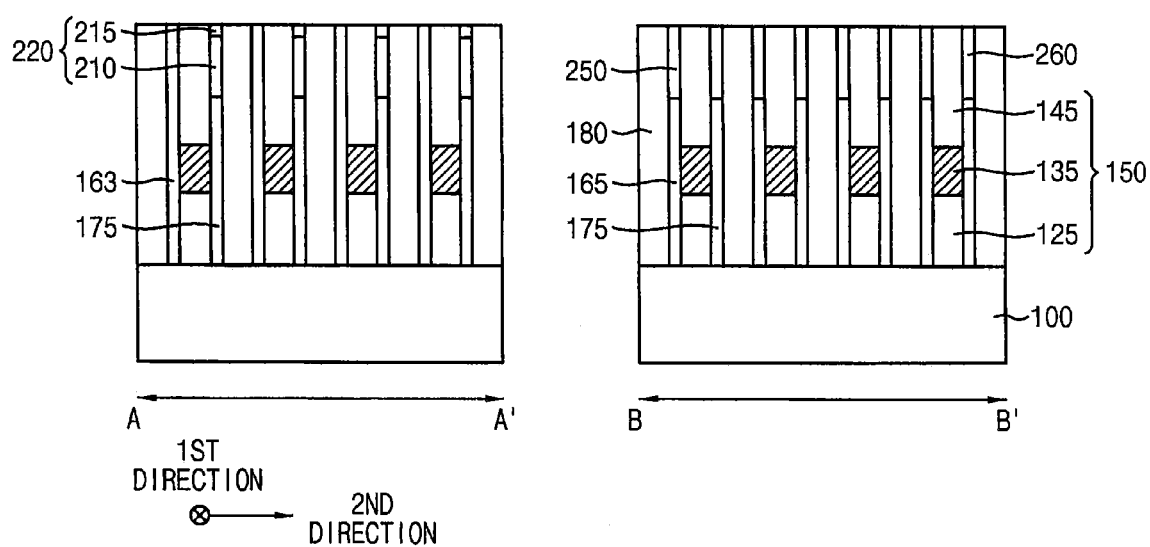

Referring to FIGS. 24 and 25, a seventh spacer pattern 260 filling each of the fourth trenches 255 may be formed.

Particularly, a seventh spacer layer may be formed on portions of the second line patterns 180, the sixth spacer patterns 250, portions of the hard mask patterns 145, and the third spacer patterns 175 that may be exposed by the third mask 237, and may be planarized by a CMP process and/or an etch back process until top surfaces of the hard mask patterns 145 may be exposed to form the seventh spacer patterns 260. The third mask 237 may be removed by an ashing process and/or a stripping process.

Thus, the first spacer patterns 163 in the odd-numbered row along the first direction, and portions of the hard mask patterns 145, the fourth spacer patterns 220 and the second line patterns 180 adjacent thereto in the second direction may be exposed. When the third mask 237 covers the division lines 190, the division lines 190 may be also exposed.

Figure 26:
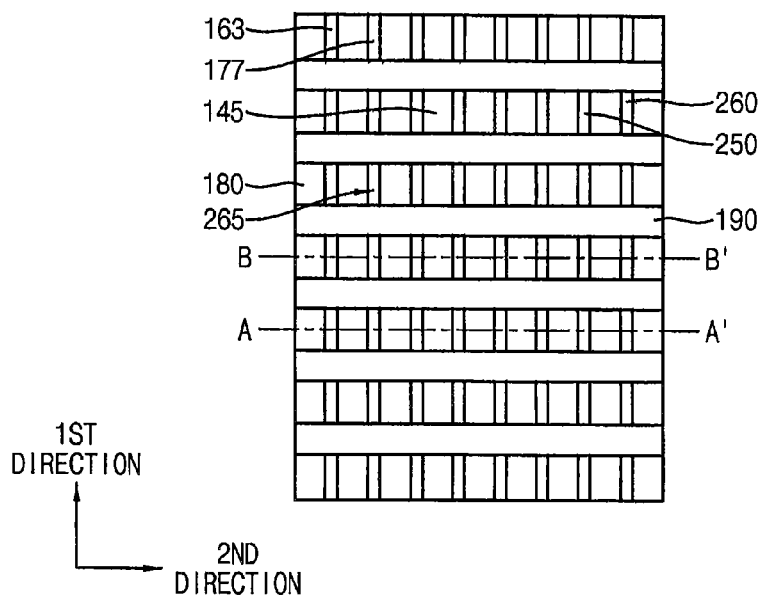
Figure 27:
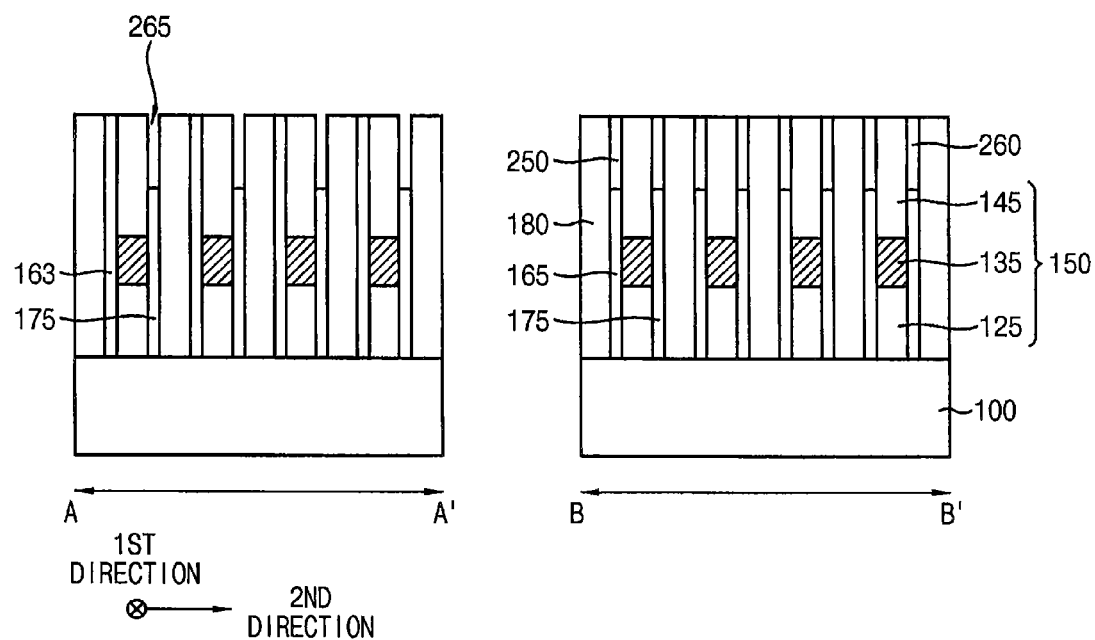

Referring to FIGS. 26 and 27, each of the exposed fourth spacer patterns 220 may be removed to form a fifth trench 265.

Thus, the third spacer patterns 175 in an odd-numbered row along the first direction may be exposed.

Figure 28:
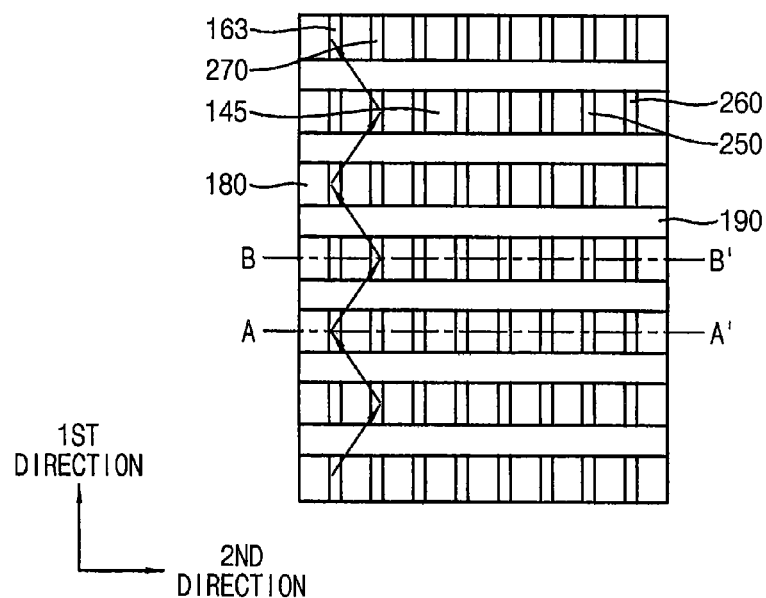
Figure 29:
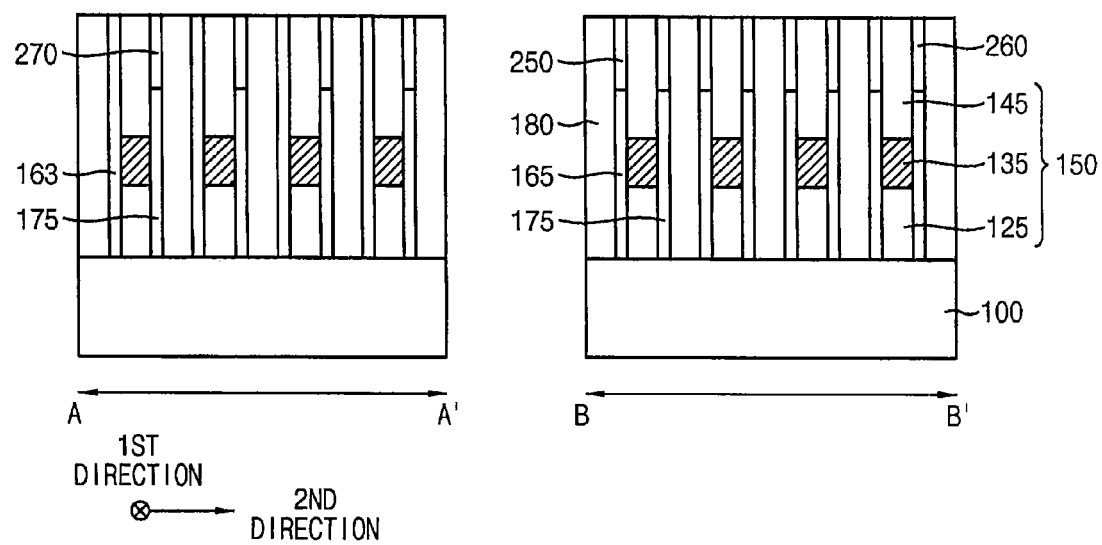

Referring to FIGS. 28 and 29, an eighth spacer pattern 270 filling each of the fifth trenches 265 may be formed.

Particularly, an eighth spacer layer may be formed on the hard mask patterns 145, the first, third, sixth and seventh spacer patterns 163, 175, 250 and 260, the second line patterns 180, and the division lines 190 to sufficiently fill the fifth trenches 265, and may be planarized by a CMP process and/or an etch back process until top surfaces of the hard mask patterns 145 may be exposed to form the eighth spacer patterns 270.

In example embodiments, the eighth spacer layer may be formed to include a material having a high etching selectivity with respect to silicon oxide, e.g., silicon nitride.

Thus, the combination of the first, third, fifth, sixth, seventh and eighth spacer patterns 163, 175, 165, 250, 260 and 270 may cover both sidewalls of each of the first line patterns 150 extending in the first direction.

In plan view, the first and seventh spacer patterns 163 and 260 may be formed on both sidewalls of each of the first line patterns 150 in a zigzag fashion in the first direction, and the sixth and eighth spacer patterns 250 and 270 may be formed on both sidewalls of the first line patterns 150 in a zigzag fashion in the first direction. The first and seventh spacer patterns 163 and 260 may be formed to include substantially the same material, e.g., silicon oxide, and the sixth and eighth spacer patterns 250 and 270 may be formed to include substantially the same material, e.g., silicon nitride.

Figure 30:
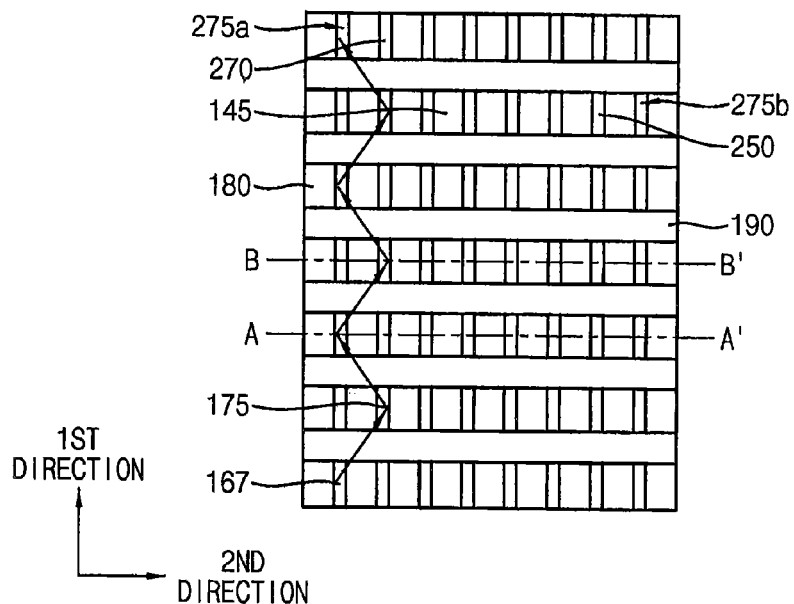
Figure 31:
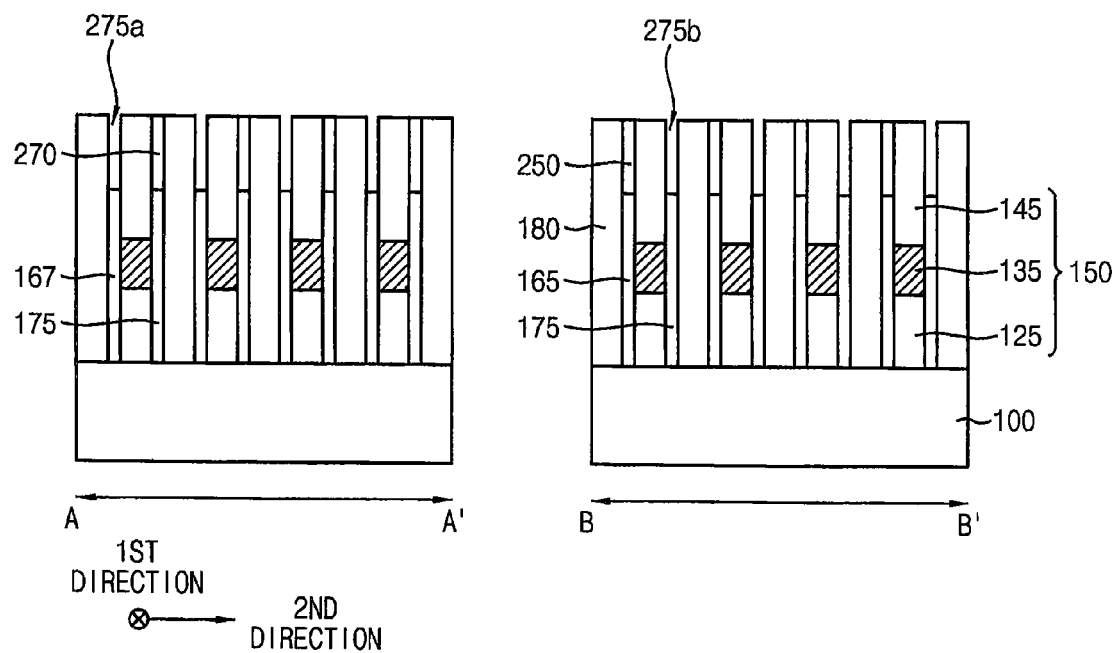

Referring to FIGS. 30 and 31, upper portions of the first spacer patterns 163 and the seventh spacer patterns 260 may be removed to form sixth and seventh trenches 275a and 275b, respectively.

Accordingly, as the upper portions of the first spacer patterns 163 may be removed, the first spacer patterns 163 may be converted into ninth spacer patterns 167, and as the seventh spacer patterns 260 may be removed, top surfaces of the third spacer patterns 175 in the even-numbered row along the first direction may be exposed.

As illustrated above, the first and seventh spacer patterns 163 and 260 may be formed in a zigzag fashion in the first direction, and thus the sixth and seventh trenches 275a and 275b may be also formed in a zigzag fashion in the first direction.

Figure 32:
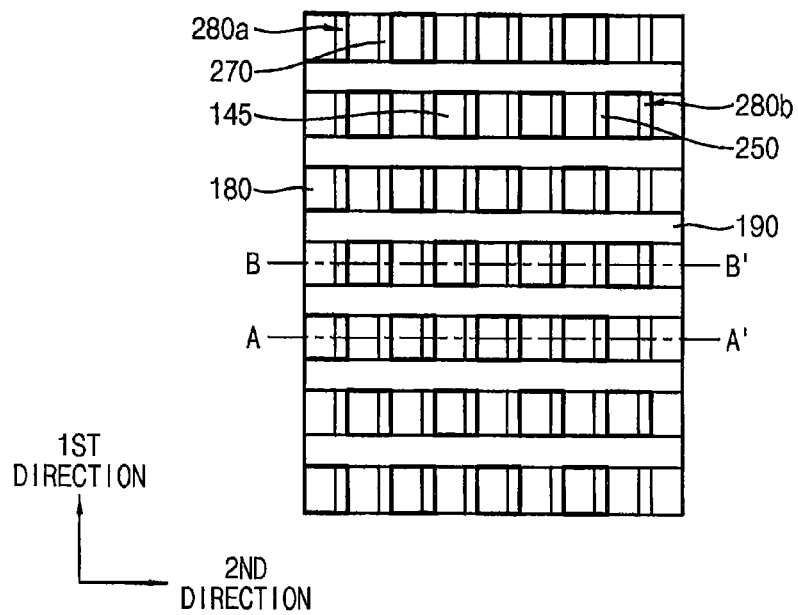
Figure 33:
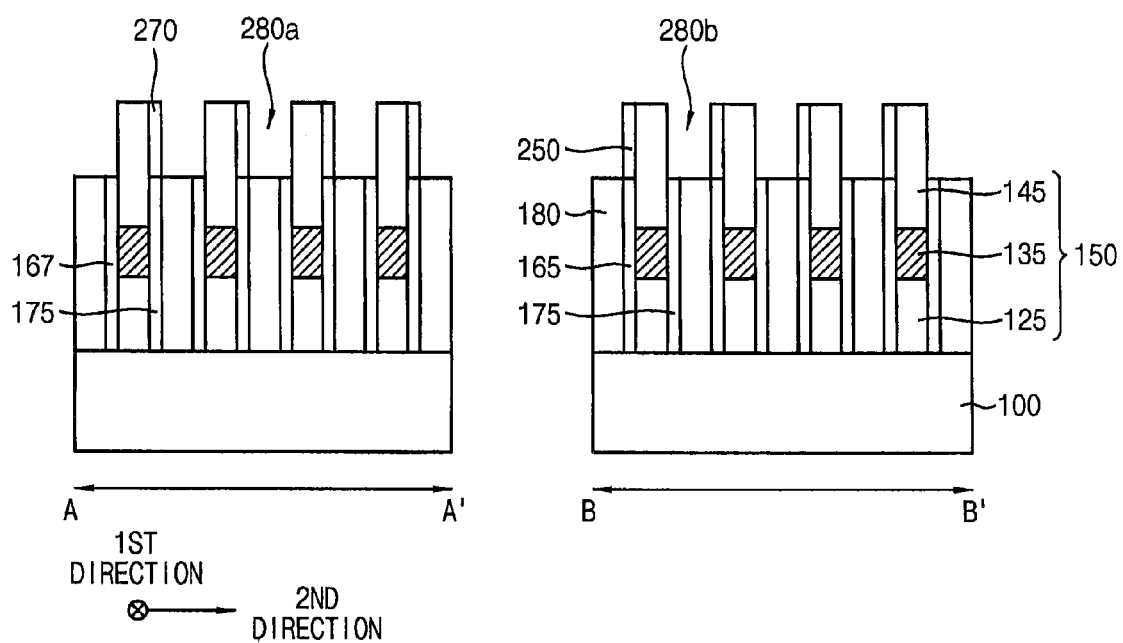

Referring to FIGS. 32 and 33, upper portions of the second line patterns 180 adjacent to the sixth and seventh trenches 275a and 275b may be removed to form eighth and ninth trenches 280a and 280b, respectively.

As the sixth and seventh trenches 275a and 275b may be formed in a zigzag fashion in the first direction, the eighth and ninth trenches 280a and 280b may be formed in a wave type in the first direction.

Figure 34:
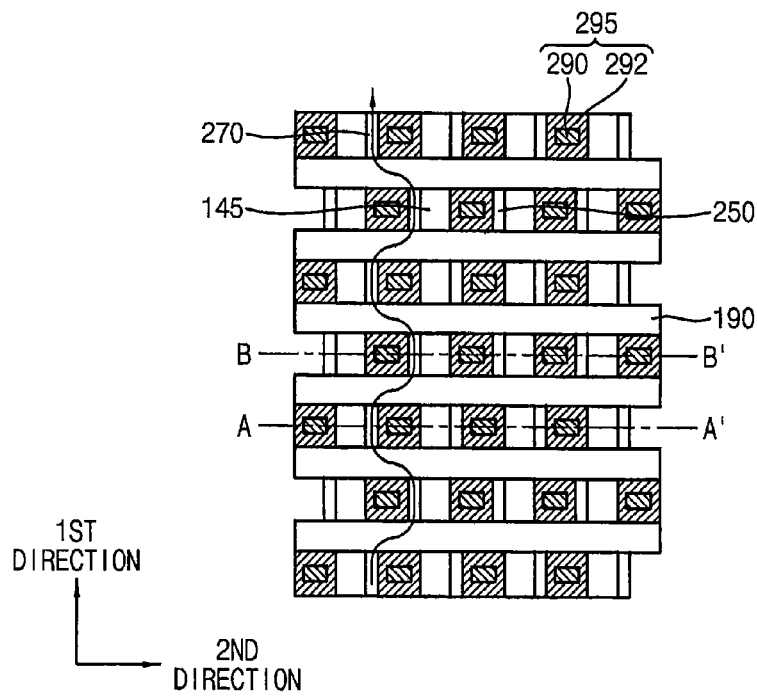
Figure 35:
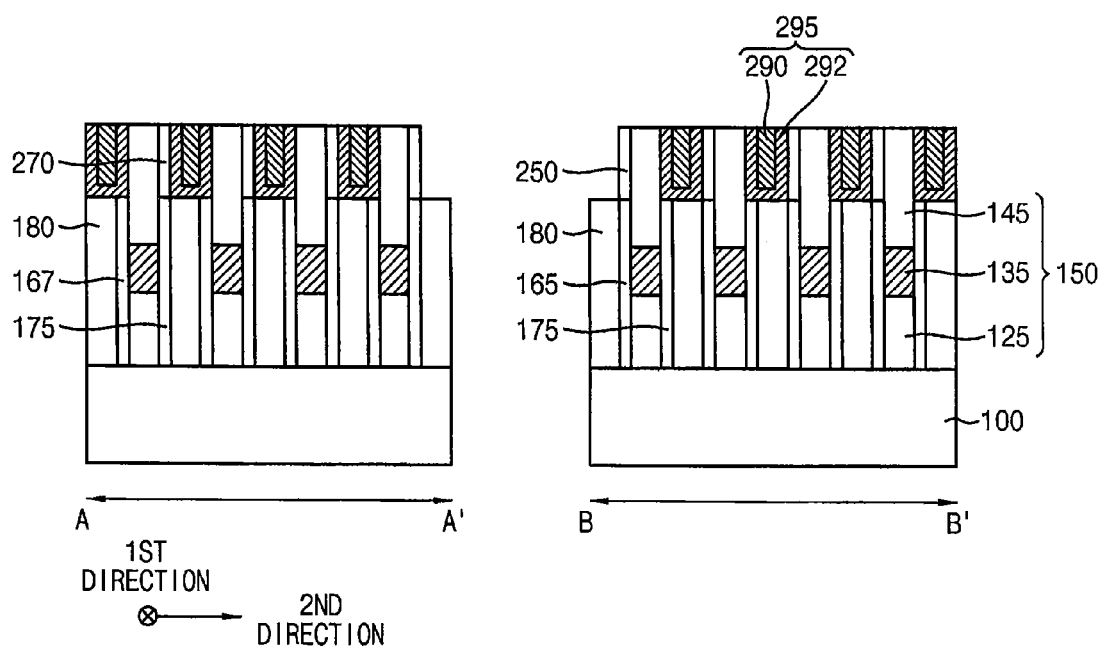

Referring to FIGS. 34 and 35, a barrier layer pattern 292 and a third conductive layer pattern 290 filling the eighth and ninth trenches 280a and 280b may be sequentially formed to define a pattern 295.

Particularly, a barrier layer may be formed on the hard mask patterns 145, the third, sixth, eighth and ninth spacer patterns 175, 250, 270 and 167, the second line patterns 180 and the division lines 190, a third conductive layer may be formed on the barrier layer to sufficiently fill the eighth and ninth trenches 280a and 280b, and the third conductive layer and the barrier layer may be planarized by a CMP process and/or an etch back process until top surfaces of the hard mask patterns 145 may be exposed to form the pattern 295 including the barrier layer pattern 292 and the third conductive layer pattern 290.

Accordingly, as the eighth and ninth trenches 280a and 280b may be formed in the wave type in the first direction, the pattern 295 may be also formed in a wave type in the first direction.

In an example embodiment, the barrier layer pattern 292 may not be formed, and in this case, the pattern 295 may be formed to include the third conductive layer pattern 290 only. In example embodiments, the third conductive layer pattern 290 may be formed to include a metal or a metal nitride.

According to the above illustrated processes, the pattern 295 can be formed to electrically connect to the underlying second line patterns 180 in a wave type arrangement.

In example embodiments, by forming spacer patterns including materials having different etching rates, the pattern 295 arranged in a wave type may be easily formed using only two masks 200 and 235.

FIGS. 36, 38, 41, 45, 47, 49, 52, 54, 56, 57, 58 and 60 are plan views illustrating stages of a method of manufacturing a semiconductor device in accordance with example embodiments, and FIGS. 37, 39, 40, 42-44, 46, 48, 50, 51, 53, 55, 59 and 61 are cross-sectional views illustrating the stages of the method of manufacturing the semiconductor device in accordance with example embodiments. Each of the cross-sectional views may include cross-sections of the corresponding plan view cut along lines G-G', H-H', K-K' and L-L', respectively. The lines G-G' and H-H' may extend in a second direction substantially parallel to a top surface of a substrate, and the lines K-K' and L-L' may extend in a first direction substantially parallel to the top surface of the substrate and substantially perpendicular to the second direction.

This method is an application of the method of forming patterns illustrated with reference to FIGS. 1 to 35 to the formation of a landing pad in a dynamic random access memory (DRAM) device.

Figure 37:
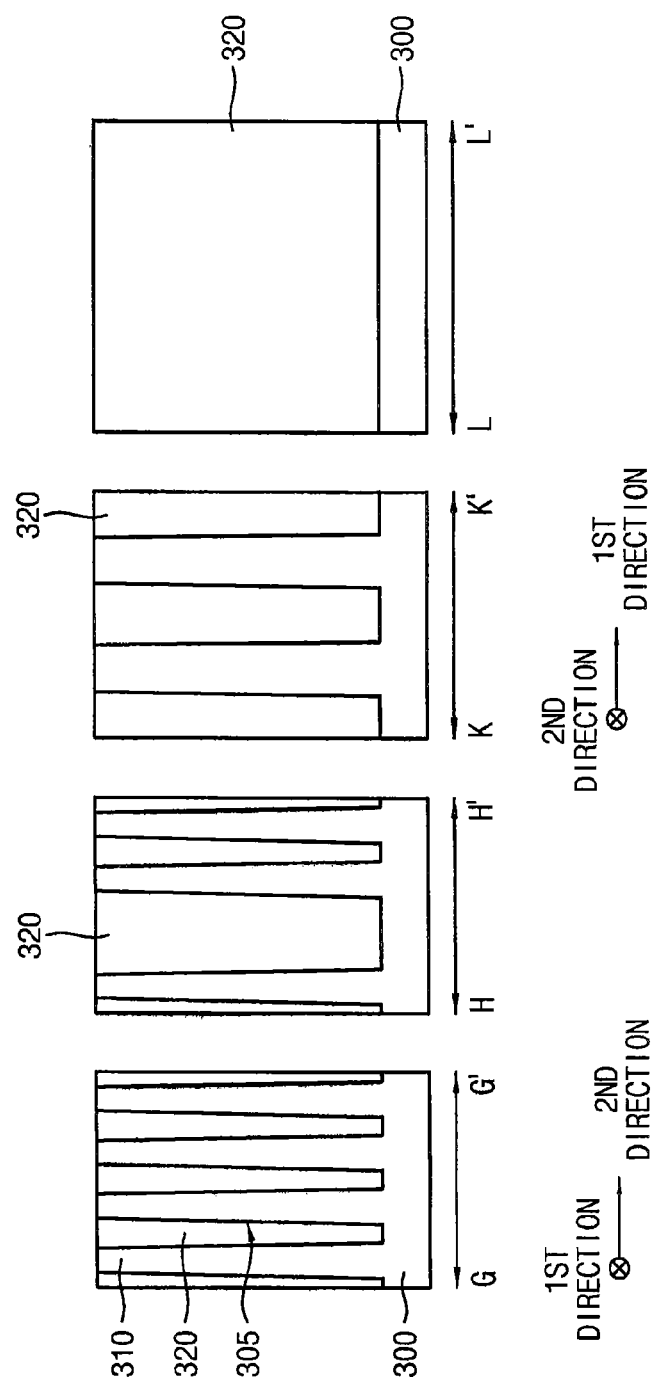

Referring to FIGS. 36 and 37, an etching mask may be formed on a substrate 300, and an upper portion of the substrate 300 may be etched using the etching mask to form a first trench 305.

For example, the substrate 300 may be a silicon substrate, a germanium substrate, a silicon-germanium substrate, a silicon-on-insulator (SOI) substrate, a germanium-on-insulator (GOI) substrate, etc. An isolation layer may be formed on the substrate 300 to sufficiently fill the first trench 305, and an upper portion of the isolation layer may be planarized until a top surface of the substrate 300 may be exposed to form an isolation layer pattern 320 in the first trench 305. The isolation layer may be formed to include an oxide, e.g., silicon oxide.

A region of the substrate 300 on which the isolation layer pattern 320 is formed may be defined as a field region, and a region of the substrate 300 on which no isolation layer pattern is formed may be defined as an active region 310. In example embodiments, a plurality of active regions 310 may be formed, and each active region 310 may extend in a third direction that is substantially parallel to the top surface of the substrate 300, however, neither parallel nor perpendicular to the first and second directions.

Impurities may be implanted into upper portions of the substrate 300 to form first and second impurity regions. The first and second impurity regions may form a transistor together with a gate structure 360 (refer to FIG. 39) subsequently formed, and may serve as source/drain regions of the transistor.

Figure 38:
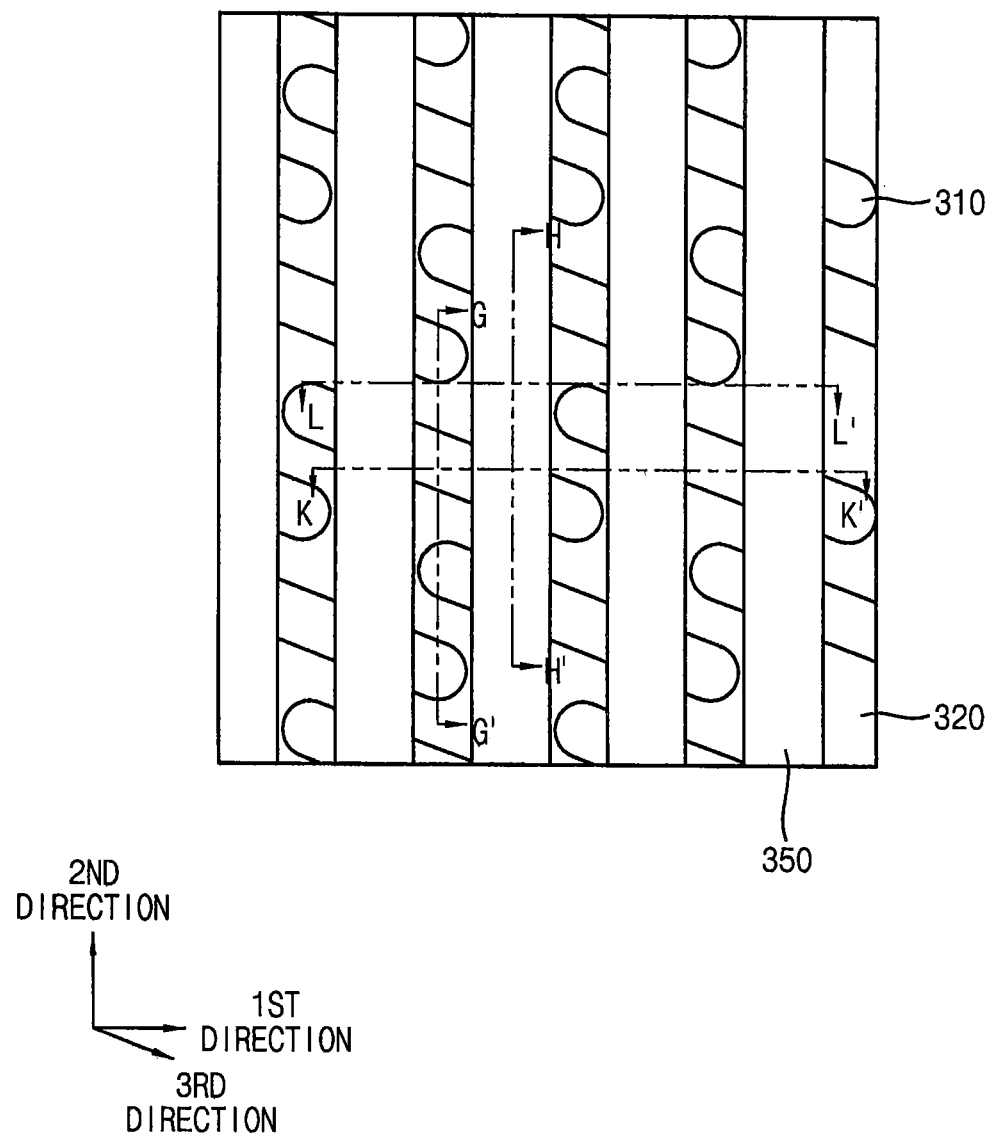
Figure 39:
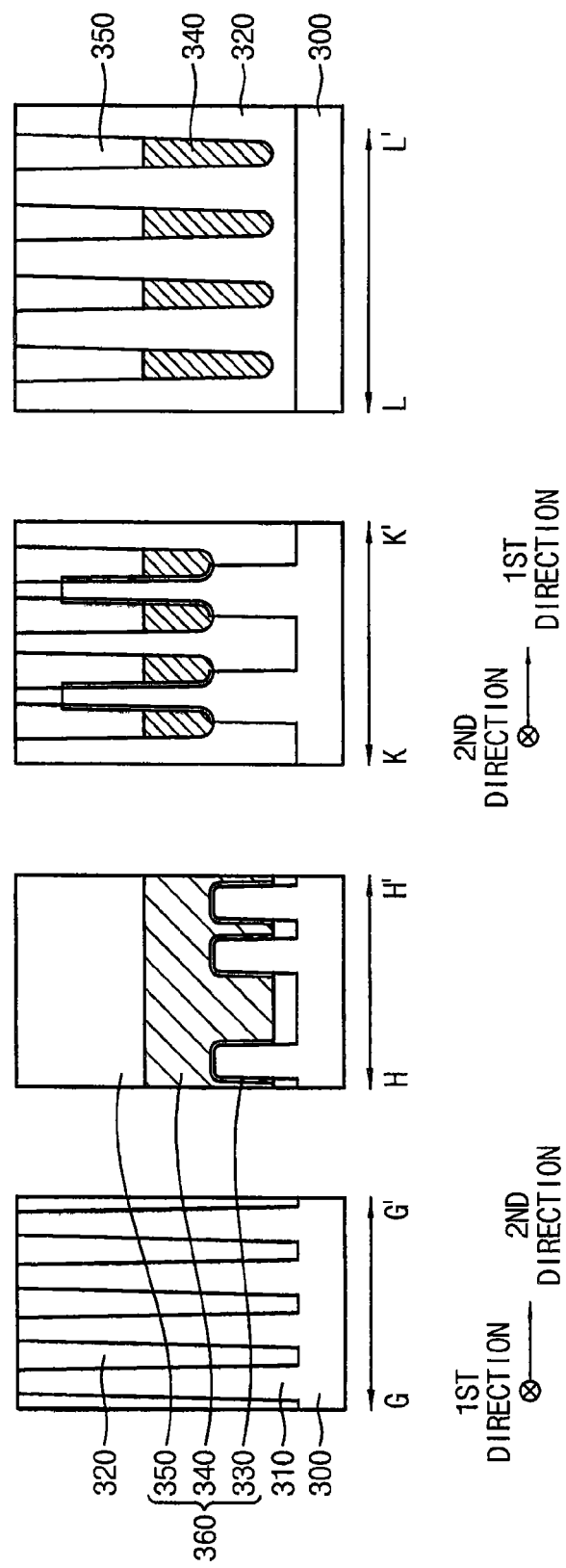

Referring to FIGS. 38 and 39, the substrate 300 and the isolation layer pattern 320 may be partially removed to form second trenches each of which may extend in the second direction. The second trenches may be formed to have different depths at the substrate 300 and the isolation layer pattern 320 according to the difference of etching rates thereof. In example embodiments, two second trenches may be formed in each active region 310 of the substrate 300.

A gate insulation layer 330 may be formed on upper surfaces of the substrate 300 exposed by the second trenches, and a gate electrode 340 and a capping layer pattern 350 may be sequentially formed in each second trench.

In example embodiments, the gate insulation layer 330 may be formed by a thermal oxidation process or a chemical vapor deposition (CVD) process, and thus may be formed to include an oxide, e.g., silicon oxide.

The gate electrode 340 may be formed by forming a gate electrode layer on the gate insulation layer 330, the active regions 310 and the isolation layer pattern 320 to sufficiently fill the second trenches, and removing an upper portion of the gate electrode layer through an etch back process and/or a CMP process. The gate electrode layer may be formed to include a metal, e.g., tungsten, titanium, tantalum, etc., or a metal nitride, e.g., tungsten nitride, titanium nitride, tantalum nitride, etc.

The capping layer pattern 350 may be formed by forming a capping layer on the gate electrode 340, the gate insulation layer 330, the active regions 310 and the isolation layer pattern 320 to sufficiently fill remaining portions of the second trenches, and planarizing an upper portion of the capping layer until a top surface of the isolation layer pattern 320 may be exposed. The capping layer may be formed to include a nitride, e.g., silicon nitride.

By the above processes, the gate structure 360 including the gate insulation layer 330, the gate electrode 340 and the capping layer pattern 350 may be formed in each second trench. In example embodiments, the gate structure 360 may extend in the second direction.

Figure 40:
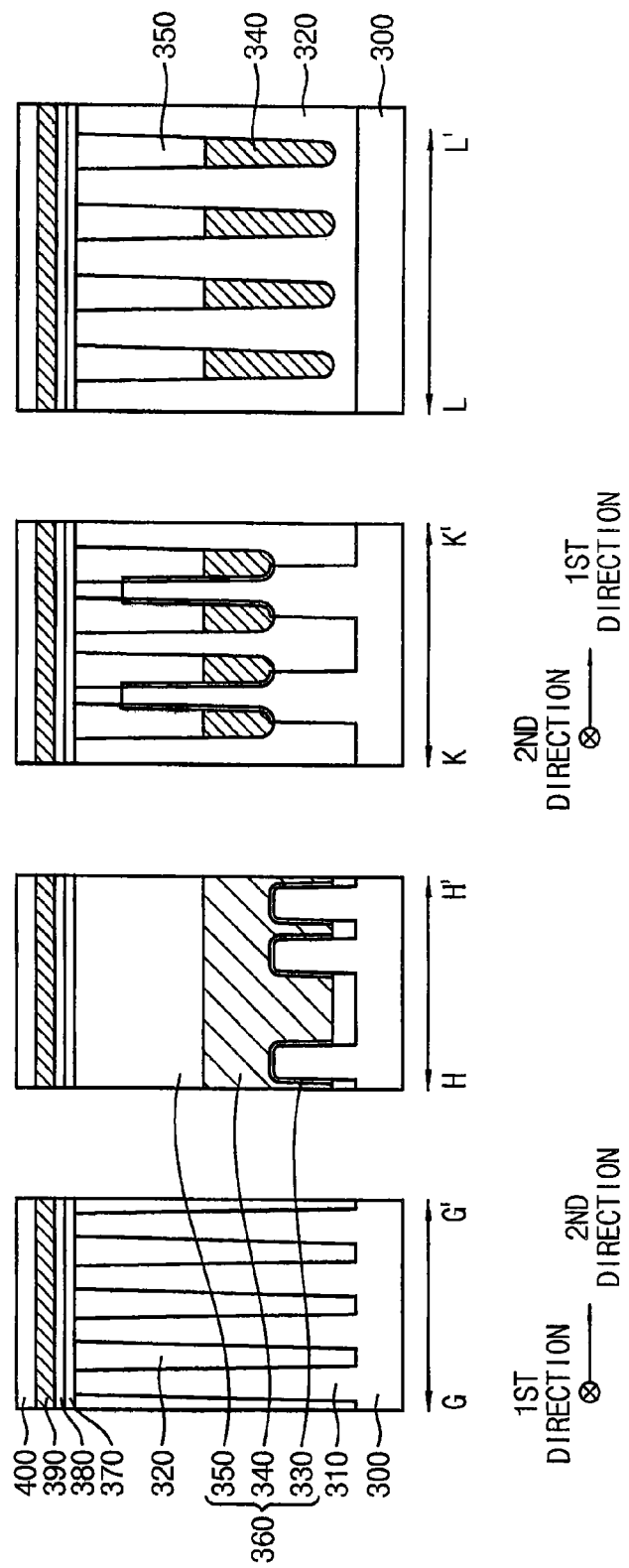

Referring to FIG. 40, a pad layer 370, a first etch stop layer 380 and a first conductive layer 390 may be sequentially formed on the active regions 310, the isolation layer pattern 320 and the capping layer pattern 350.

The pad layer 370 may be formed to include an oxide, e.g., silicon oxide, and the first etch stop layer 380 may be formed to include a nitride, e.g., silicon nitride. Thus, the pad layer 370 and the etch stop layer 380 may be formed to include materials having different etching rates from each other.

The first conductive layer 390 may be formed to include, e.g., doped polysilicon.

A first mask layer 400 and a photoresist pattern may be sequentially formed on the first conductive layer 390. The photoresist pattern may partially expose a top surface of the first mask layer 400.

The first mask layer 400 may be formed to include an oxide, e.g., silicon oxide. Alternatively, the first mask layer 400 may have a multi-layered structure including a silicon oxide layer and a silicon nitride layer.

Figure 41:
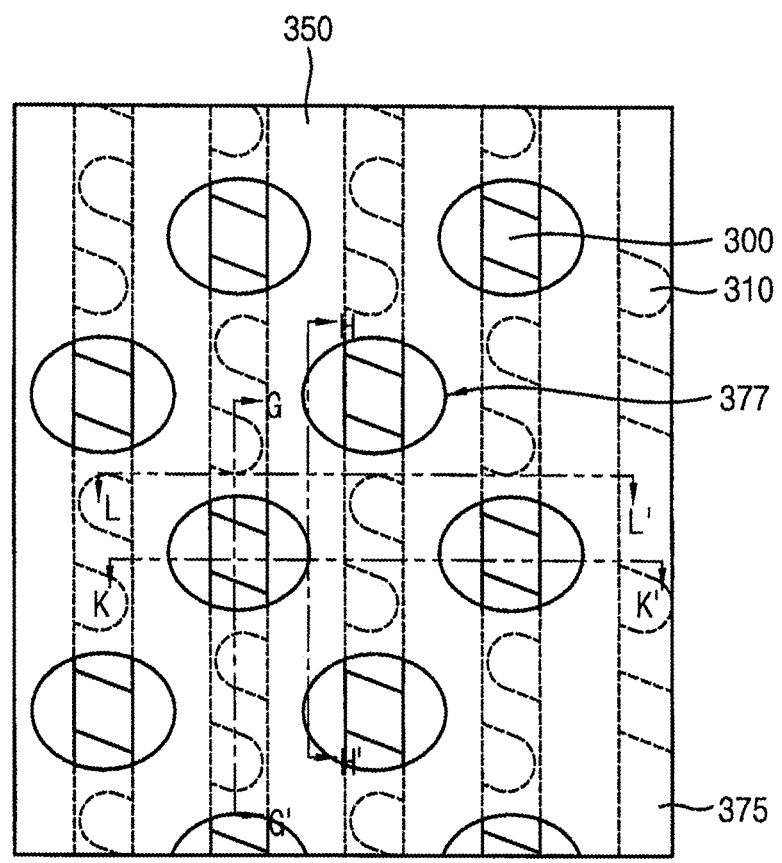
Figure 42:
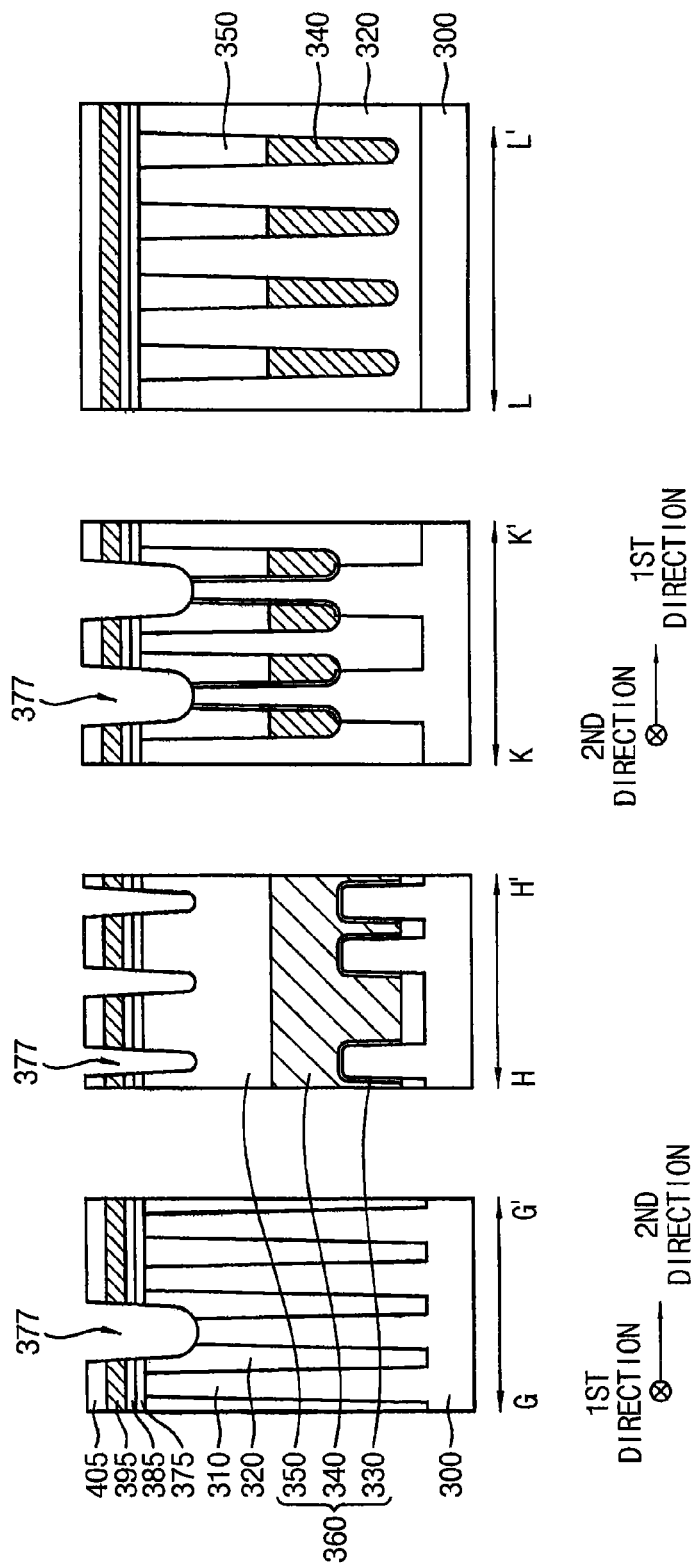

Referring to FIGS. 41 and 42, the first mask layer 400 may be patterned using the photoresist pattern as an etching mask to form a first mask 405, and the first conductive layer 390, the first etch stop layer 380, the pad layer 370 and the first impurity region of the substrate 300 may be partially removed using the first mask 405 as an etching mask to form a plurality of recesses 377. The recesses 377 may be formed to have an island-like shape from each other both in the first and second directions, and may expose top surfaces of the active regions 310.

Thus, a pad layer pattern 375, an etch stop layer pattern 385 and a first conductive layer pattern 395 may be formed, and when the recesses 377 are formed, the capping layer pattern 350 and the isolation layer pattern 320 may be partially removed.

Figure 43:
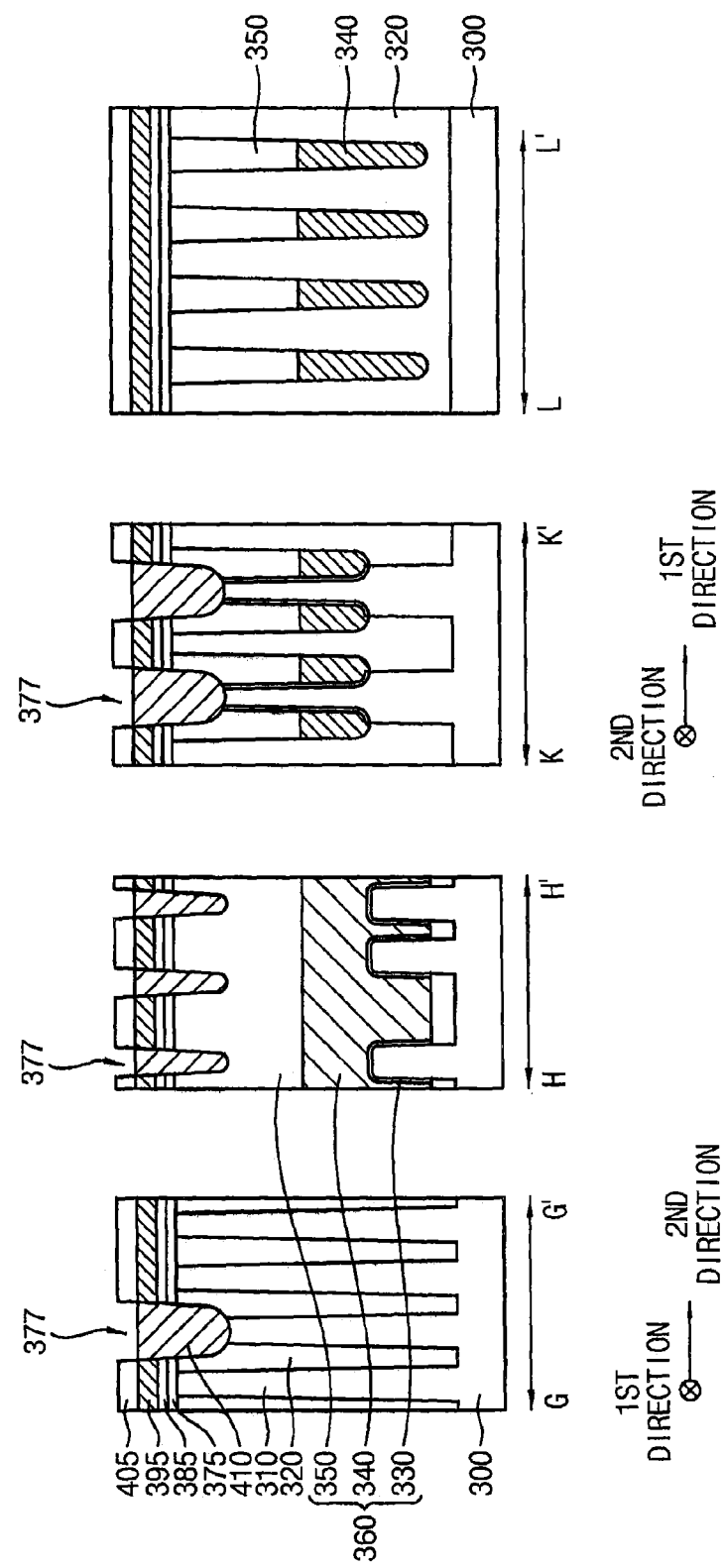

Referring to FIG. 43, a second conductive layer pattern 410 filling each of the recesses 377 may be formed.

In example embodiments, the second conductive layer patterns 410 may be formed by forming a second conductive layer on the active regions 310, the capping layer pattern 350, the isolation layer pattern 320 and the first mask 315 to sufficiently fill the recesses 377, and removing an upper portion of the second conductive layer by a CMP process and/or an etch back process. Thus, each of the second conductive layer patterns 410 may have a top surface substantially coplanar with a top surface of the first conductive layer pattern 395.

The second conductive layer patterns 410 may be formed to have an island-like shape from each other both in the first and second directions. The second conductive layer may be formed to include, e.g., doped polysilicon.

The first mask 405 may be removed, and a cleaning process may be performed on the substrate 300.

The first mask 405 may be removed by, e.g., a wet etch process. The cleaning process may be performed by a stripping process, a plasma native oxide cleaning (PNC) process or a combination thereof. Thus, no native oxide layer may remain on the first and second conductive layer patterns 395 and 410.

Figure 44:
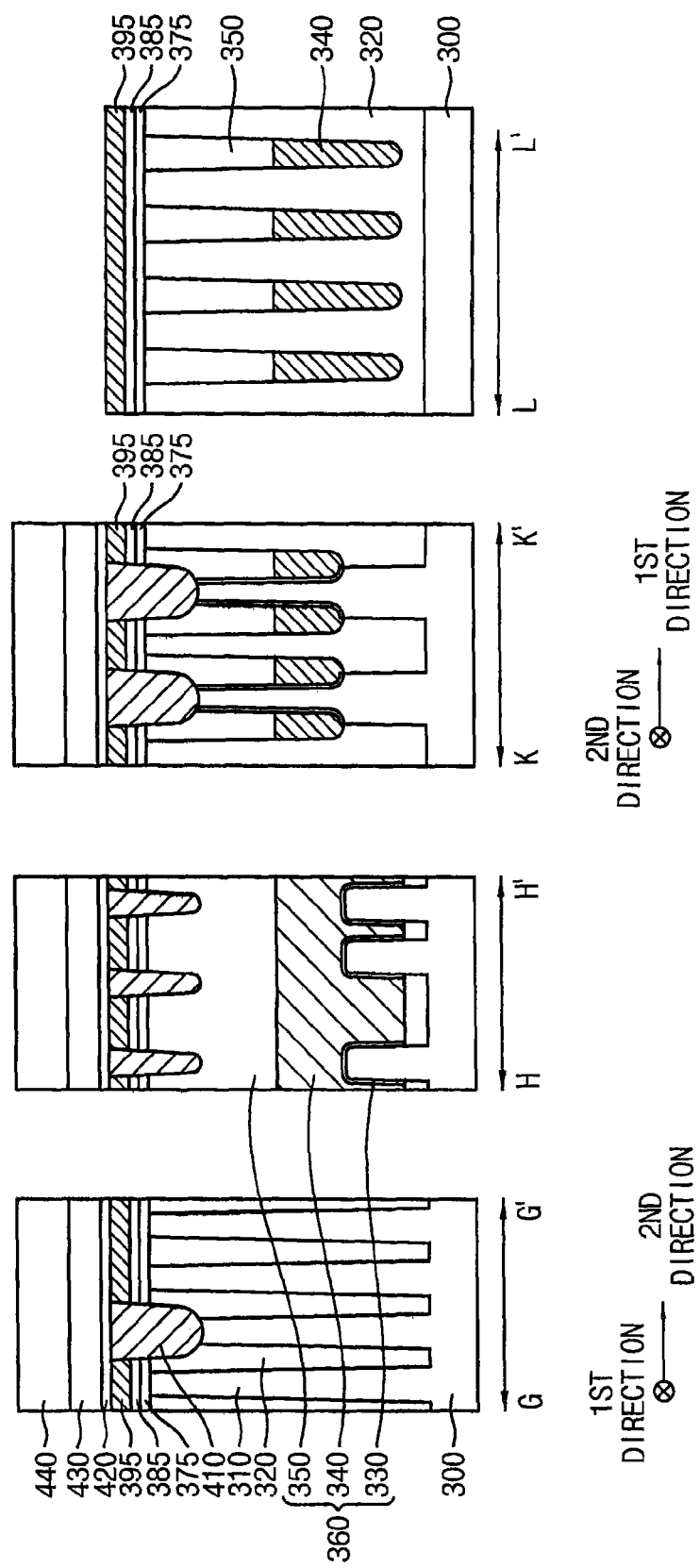

Referring to FIG. 44, a first barrier layer 420, a third conductive layer 430 and a second mask layer 440 may be sequentially formed on the first and second conductive layer patterns 395 and 410, the capping layer pattern 350 and the isolation layer pattern 320.

The first barrier layer may be formed to include a metal, e.g., titanium, tantalum, etc., and/or a metal nitride, e.g., titanium nitride, tantalum nitride, etc. The third conductive layer may be formed to include a metal having a resistance lower than those of the first and second conductive layer patterns 395 and 410, e.g., tungsten. The second mask layer 440 may be formed to include, e.g., silicon nitride.

Figure 45:
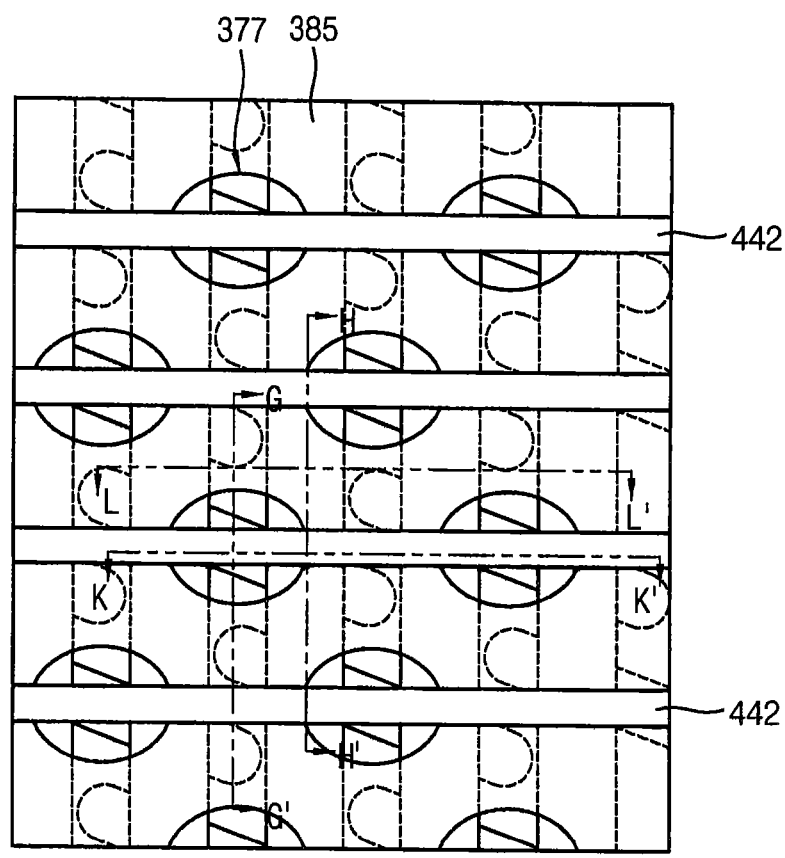
Figure 46:
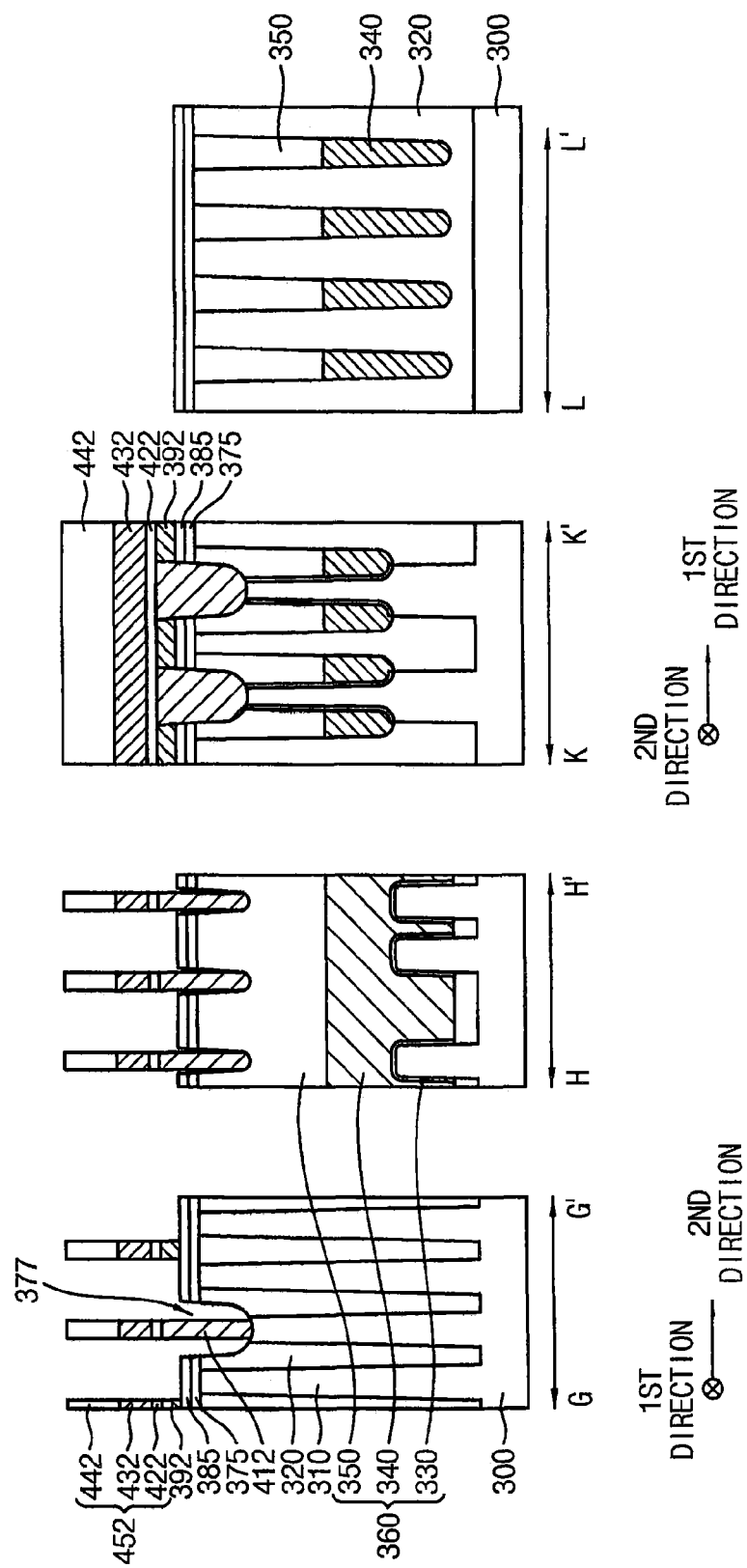

Referring to FIGS. 45 and 46, the second mask layer 440 may be partially etched to form a second mask 442, and the third conductive layer 430, the first barrier layer 420, and the first and second conductive layer patterns 395 and 410 may be patterned using the second mask 442 as an etching mask. Thus, a bit line structure 452 including a first barrier layer pattern 422, a third conductive layer pattern 432 and a second mask 442 sequentially stacked, and a bit line contact 412 under the bit line structure 452 may be formed.

In example embodiments, as the bit line contact 412 and the bit line structure 452 may be formed, a top surface of the etch stop layer pattern 385 may be partially exposed.

In example embodiments, the bit line contact 412 may partially fill each of the recesses 377, and a plurality of bit line contacts 412 having an island-like shape from each other may be formed both in the first and second directions. In example embodiments, each bit line structure 452 may extend in the first direction, and a plurality of bit line structures 452 may be formed spaced apart from one another in the second direction.

Figure 48:
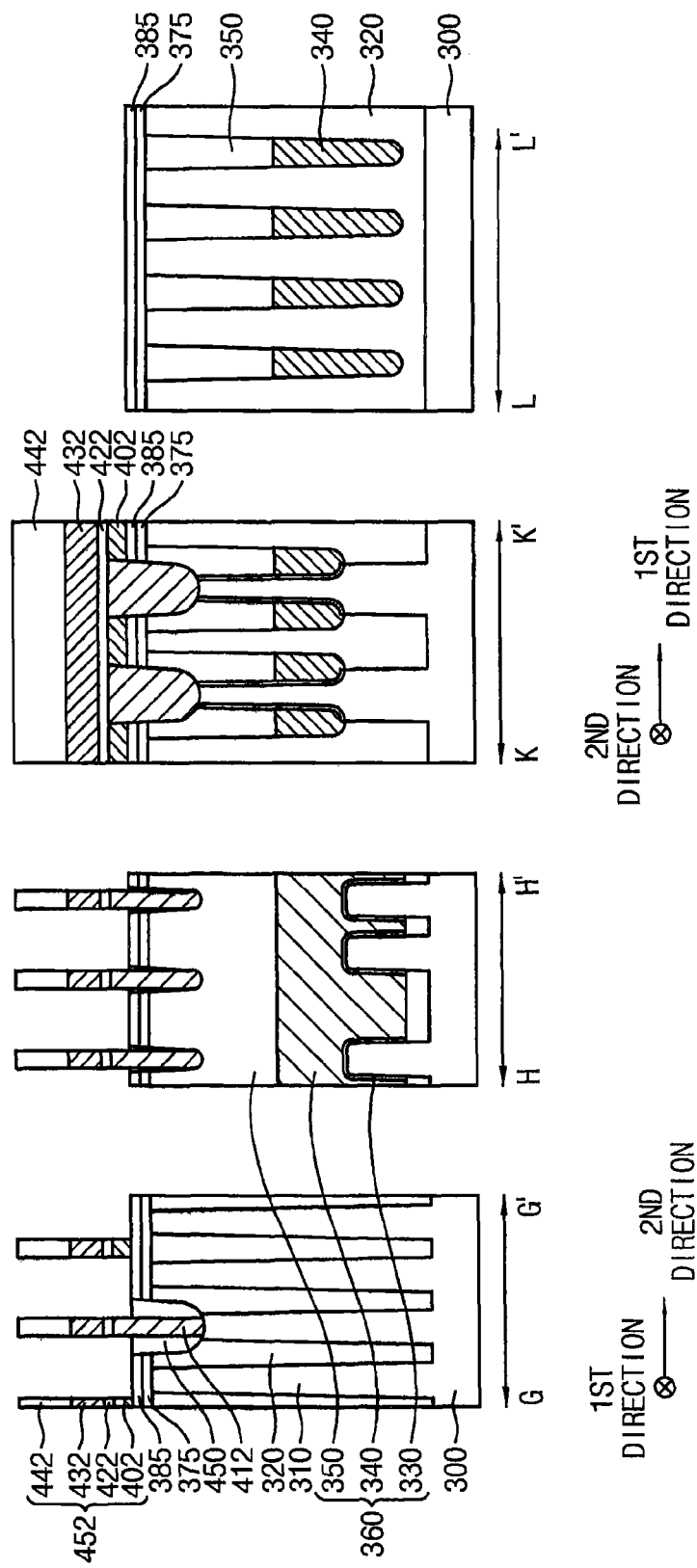

Referring to FIGS. 47 and 48, an insulation layer pattern 450 may be formed to fill each of the recesses 377.

Particularly, an insulation layer may be formed on the etch stop layer pattern 385, the bit line structure 452 and inner walls of the recesses 377, and may be partially removed to form the insulation layer pattern 450 filling each of the recesses 377. Thus, the insulation layer pattern 450 may be formed to partially surround a sidewall of the bit line contact 412. In example embodiments, the insulation layer may be formed to include a nitride, e.g., silicon nitride.

Figure 50:
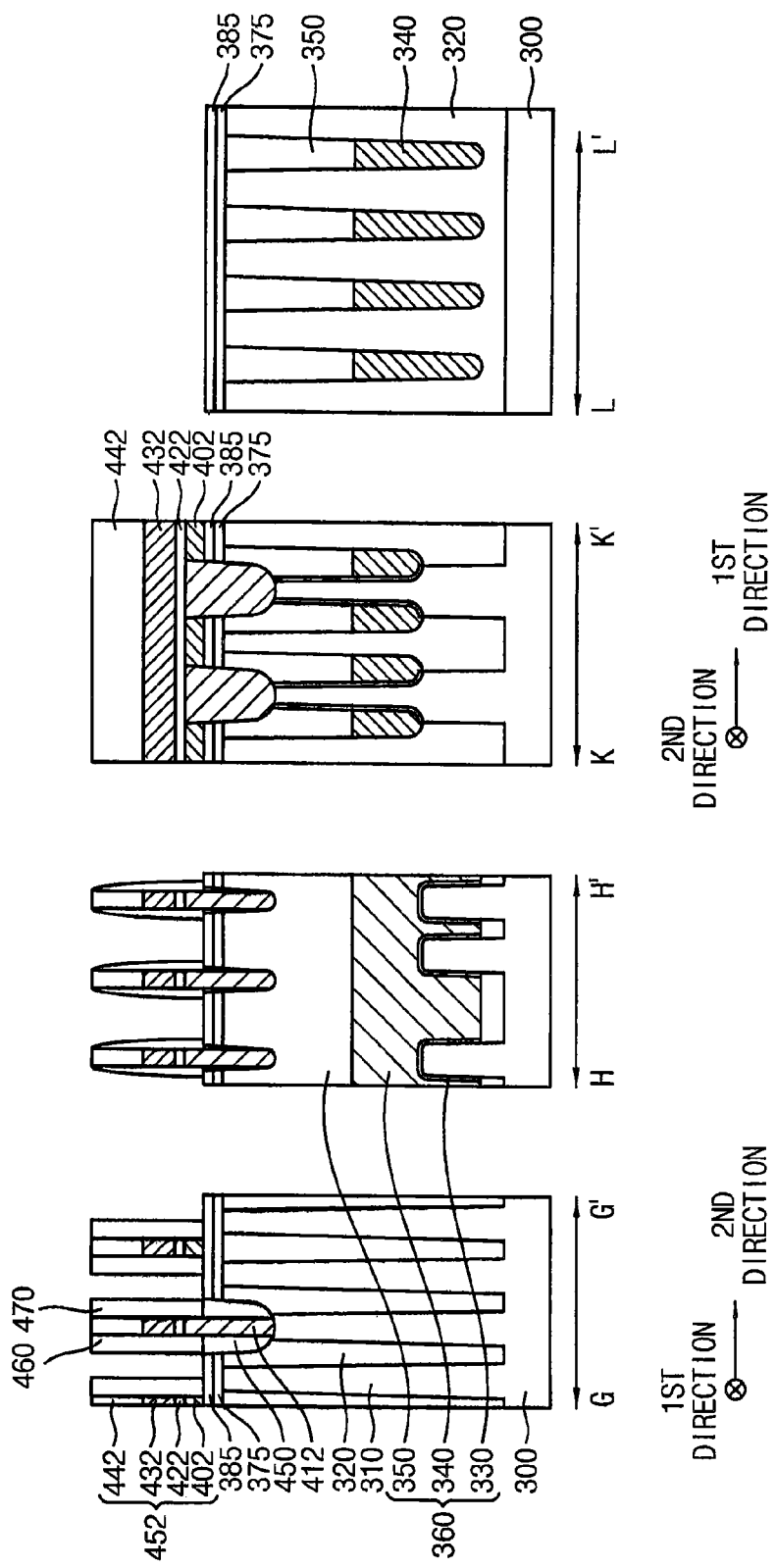

Referring to FIGS. 49 and 50, processes substantially the same as or similar to those illustrated with reference to FIGS. 3 and 4 may be performed to form spacers 460 and 470 on both sidewalls of each of the bit line structures 452.

In example embodiments, the spacers 460 and 470 may be formed by forming a spacer layer to cover the bit line structures 452, and etching the spacer layer by an exposure process using KrF, ArF, EUV or X-ray. Thus, a first spacer 460 may be formed on a sidewall of each of the bit line structures 452, and a second spacer 470 may be formed on the other sidewall of each of the bit line structures 452. In example embodiments, the spacer layer may be formed to include an oxide, e.g., silicon oxide.

Figure 51:
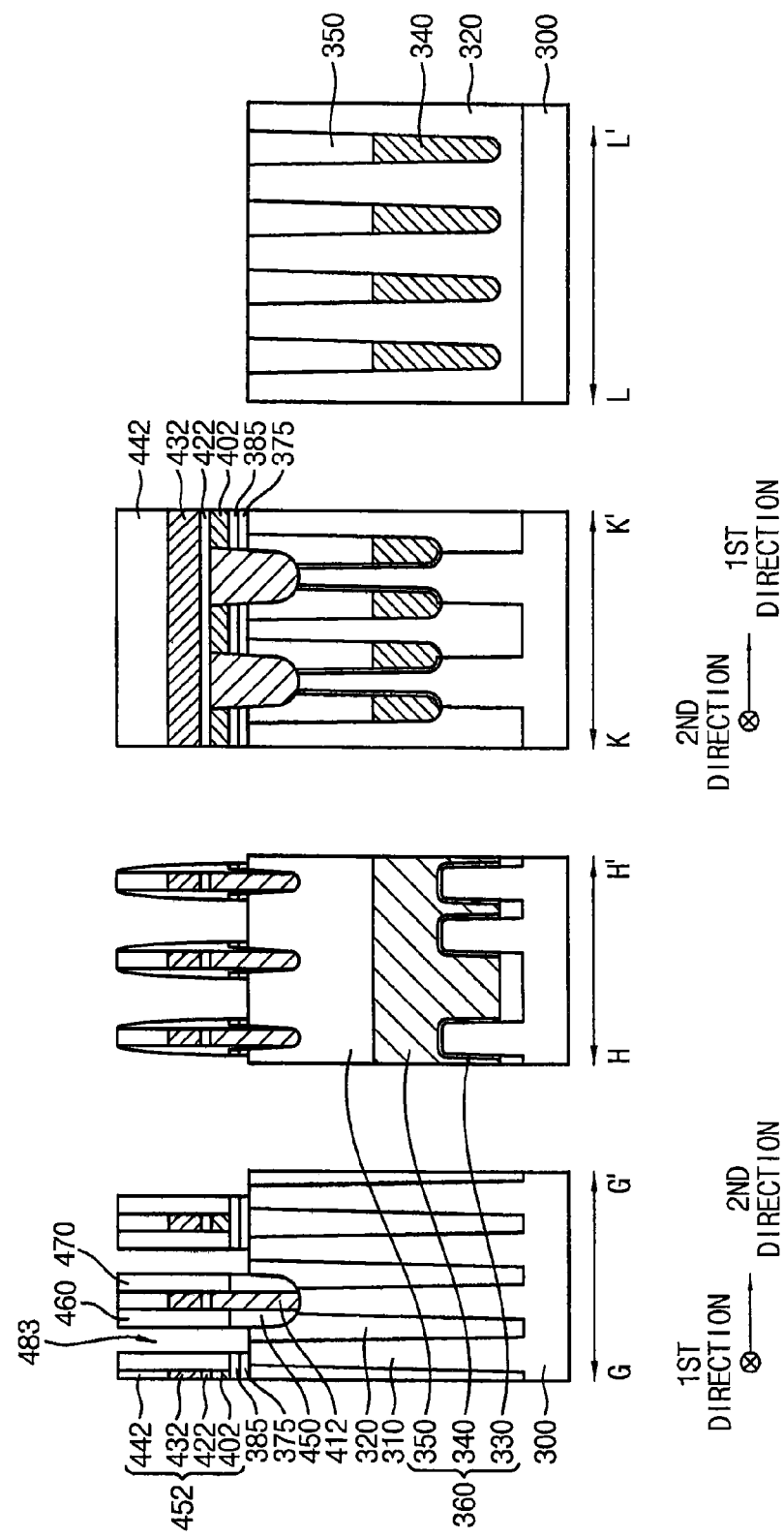

Referring to FIG. 51, the etch stop layer pattern 385 and the pad layer pattern 375 not covered by the spacers 460 and 470 and the bit line structures 452 may be etched to form an opening 483 partially exposing a top surface of each of the active regions 310. Thus, the opening 483 may partially expose a top surface of the first impurity region at an upper portion of the substrate 300 adjacent the bit line structure 452. In example embodiments, the opening 483 may be formed to extend in the first direction between structures each of which may include the bit line structure 452 and the spacers 460 and 470, and a plurality of openings 483 may be formed in the second direction. Thus, two openings 483 may be formed on each of the active regions 310.

Figure 53:
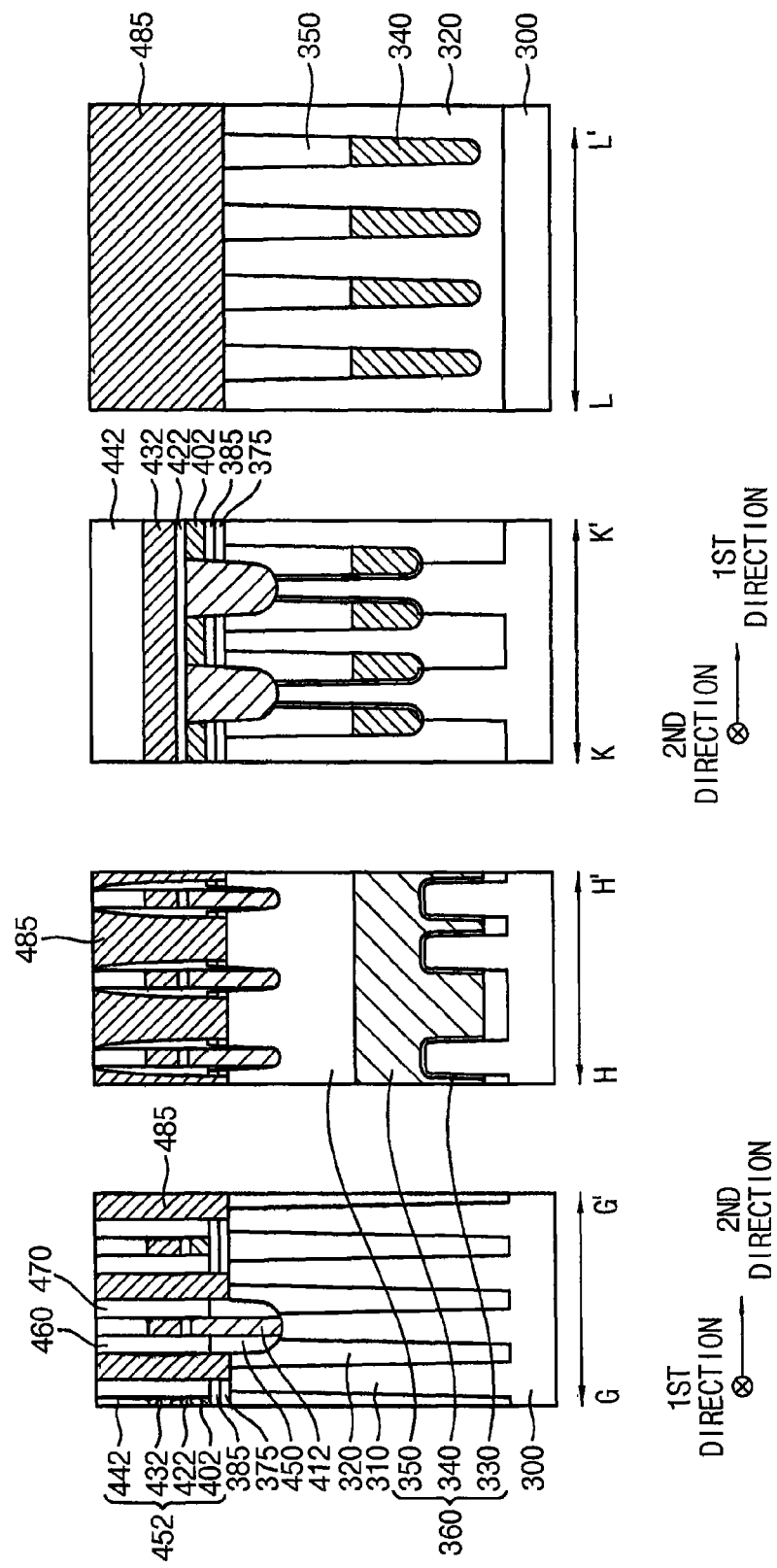

Referring to FIGS. 52 and 53, processes substantially the same as or similar to those illustrated with reference to FIGS. 5 and 6 may be performed to form a contact plug 485 filling each of the openings 483 and extending in the first direction. The contact plug 485 may be formed by forming a fourth conductive layer on the exposed top surface of the active region 310, the pad layer pattern 375, the etch stop layer pattern 385, the bit line structure 452 and the spacers 460 and 470, and planarizing the fourth conductive layer until a top surface of the second mask 442 may be exposed. Thus, the contact plug 485 may be formed on the active region 310 to contact a top surface of the second impurity region. In example embodiments, the fourth conductive layer may be formed to include a conductive material, e.g., doped polysilicon.

Figure 54:
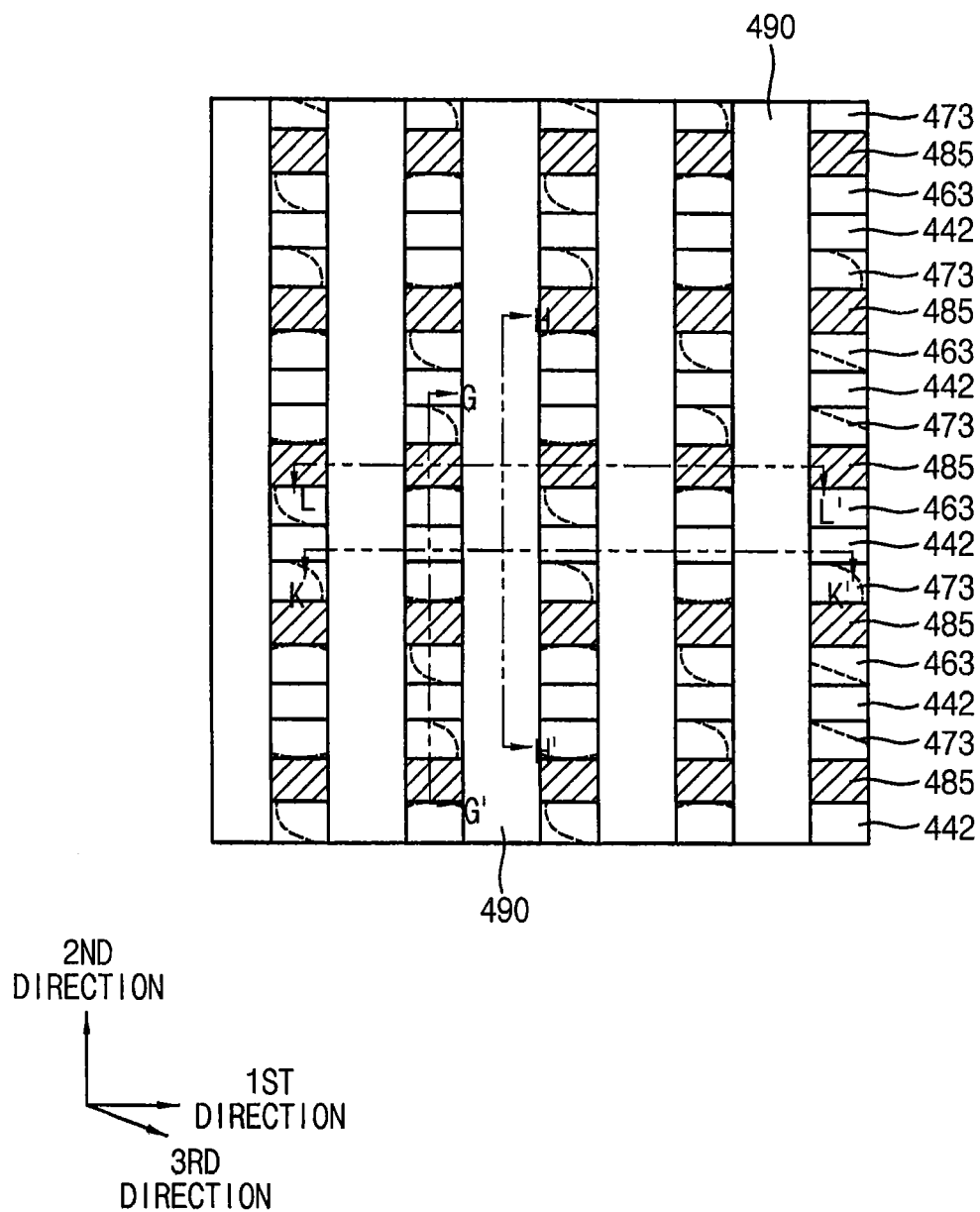
Figure 55:
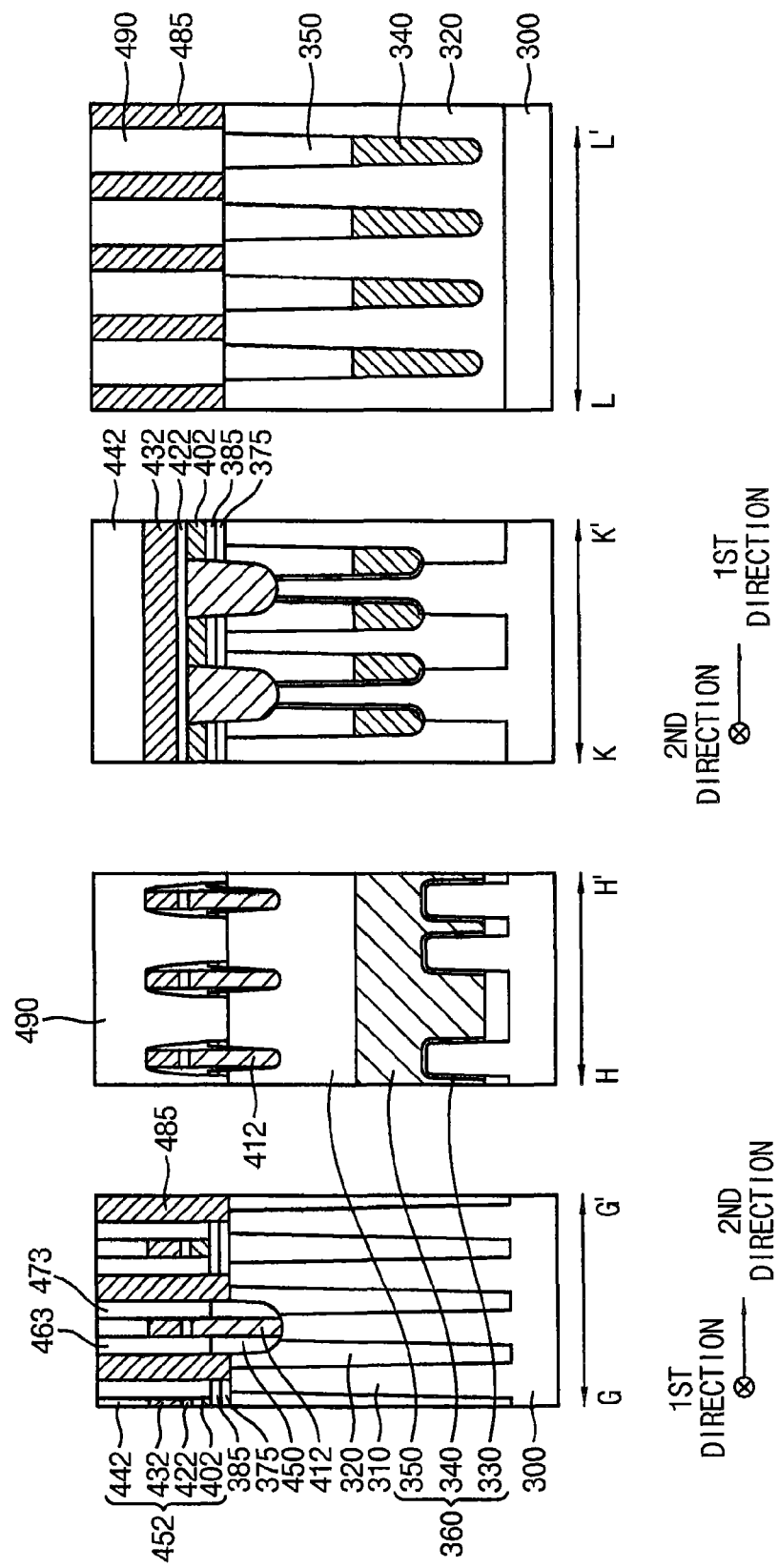

Referring to FIGS. 54 and 55, processes substantially the same as or similar to those illustrated with reference to FIGS. 7 to 9 may be performed to form a plurality of third trenches each of which may extend in the second direction and penetrate at least upper portions of the bit line structure 452, the contact plug 485 and the first and second spacers 460 and 470.

For example, a division line 490 filling each of the third trenches may be formed to include an insulating material, e.g., silicon nitride. In example embodiments, the division line 490 may extend in the second direction, and a plurality of division lines 490 may be formed spaced apart from one another in the first direction. Thus, an upper portion of each of the first spacers 460 extending in the first direction may be divided into first spacer patterns 463 disposed in the first direction, and an upper portion of each of the second spacers 470 may be divided into second spacer patterns 473 disposed in the first direction. Thus, the first and second spacers 463 and 473 may be disposed in a checkerboard arrangement as the first and second spacer patterns 463 and 475 have been separated in both the first and second directions by formation of the division lines 490.

Additionally, the second mask 442 extending in the first direction may be divided into a plurality of pieces disposed in the first direction, and the contact plug 485 extending in the first direction may be divided into a plurality of pieces disposed in the first direction.

Figure 56:
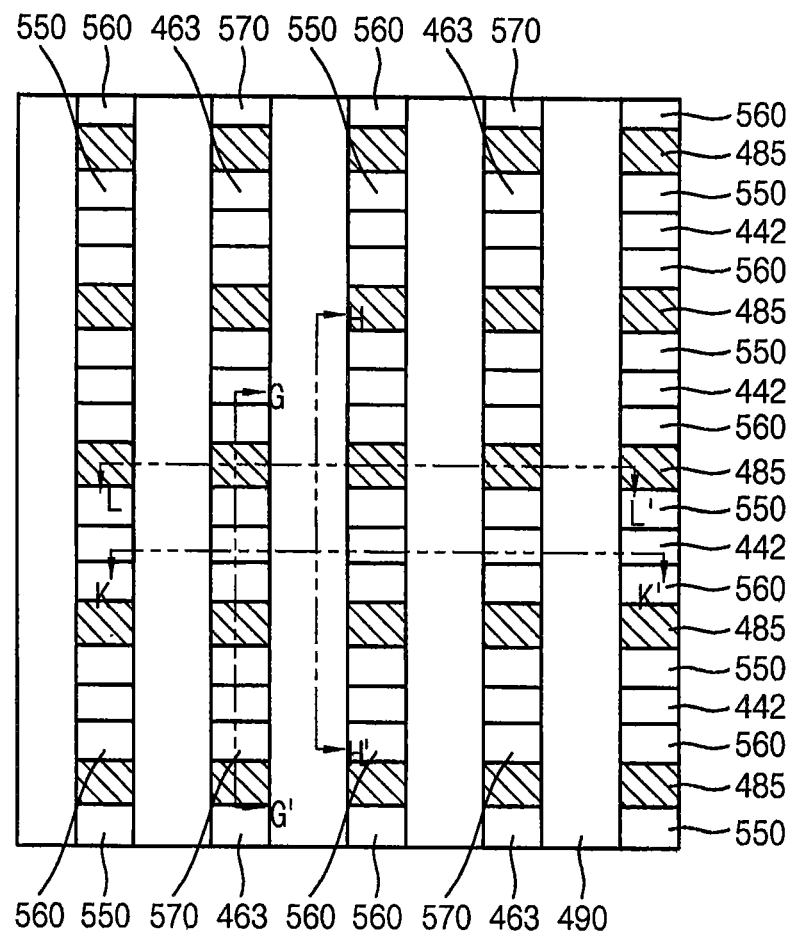

Referring to FIG. 56, processes substantially the same as or similar to those illustrated with reference to FIGS. 10 to 29 may be performed. Thus, first spacer patterns 463, third spacer patterns 475 (refer to FIG. 59), fifth spacer patterns (not shown), sixth spacer patterns 550, seventh spacer patterns 560 and eighth spacer patterns 570 may be formed on both sidewalls of each of the bit line structures 452 extending in the first direction.

Particularly, a third mask covering the first spacer patterns 463 may be formed, and upper portions of the second spacer patterns 473 may be etched using the third mask as an etching mask to form fourth trenches, and each of the second spacer patterns 473 may be converted into a third spacer pattern 475. Fourth spacer patterns may be formed to fill fourth trenches, respectively. Each of the fourth spacer pattern may be formed to include a SOH layer pattern and a PE-SiON layer pattern sequentially stacked.

A fourth mask covering the first spacer patterns 463 in an odd-numbered row along the first direction may be formed, and upper portions of the first spacer patterns 463 in an odd-numbered row not covered by the fourth mask may be etched to form fifth trenches. The first spacer patterns 463 in the odd-numbered row may be converted into fifth spacer patterns, respectively. The sixth spacer patterns 550 may be formed to sufficiently fill the fifth trenches using an insulating material, e.g., silicon nitride.

Portions of the fourth spacer patterns not covered by the fourth mask may be removed to form sixth trenches, and seventh spacer patterns 560 may be formed to fill the sixth trenches using, e.g., silicon oxide.

The fourth mask may be removed to expose portions of the fourth spacer patterns, which may be removed to form seventh trenches, and eighth spacer patterns 570 may be formed to fill the seventh trenches using an insulating material, e.g., silicon nitride.

In plan view, the first and seventh spacer patterns 463 and 560 may be formed in a zigzag fashion on both sidewalls of each of the bit line structures 452, and the sixth and eighth spacer patterns 550 and 570 may be formed in a zigzag fashion on both sidewalls of each of the bit line structures 452.

Figure 57:
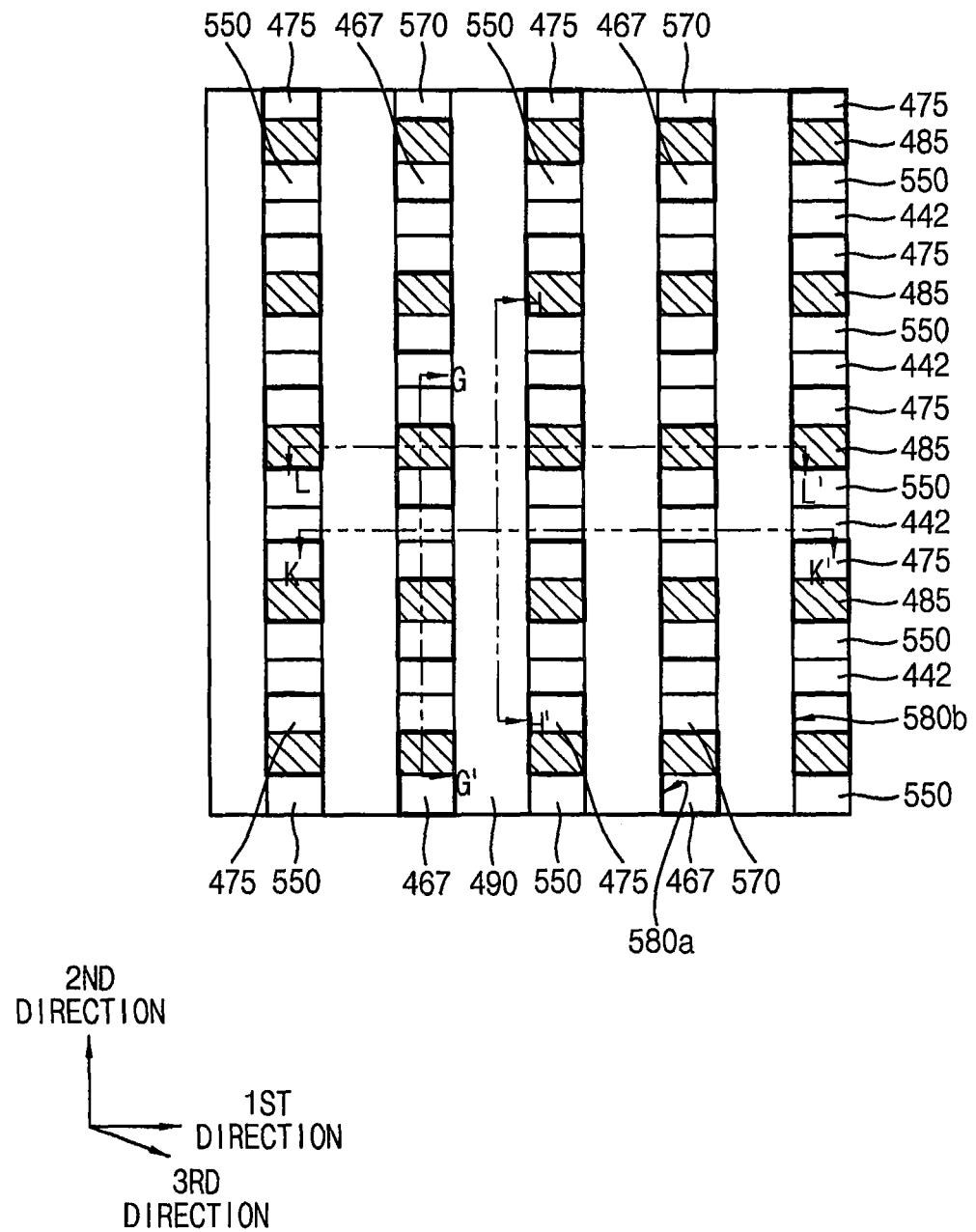

Referring to FIG. 57, processes substantially the same as or similar to those illustrated with reference to FIGS. 30 to 33 may be performed. Thus, upper portions of the first spacer patterns 463 and the seventh spacer patterns 560, and upper portions of the contact plugs 485 adjacent thereto may be removed to form eighth and ninth trenches 580*a* and 580*b*, respectively.

Accordingly, as the upper portions of the first spacer patterns 463 may be removed, the first spacer patterns 463 may be converted into ninth spacer patterns 467 (refer to FIG. 59), respectively, and the top surfaces of the third spacer patterns 475 in the even-numbered row may be exposed again.

As illustrated above, the first and seventh spacer patterns 463 and 560 may be formed in the zigzag fashion in the first direction, and thus the eighth and ninth trenches 580a and 580b may be formed in a wave type in the first direction.

Figure 59:
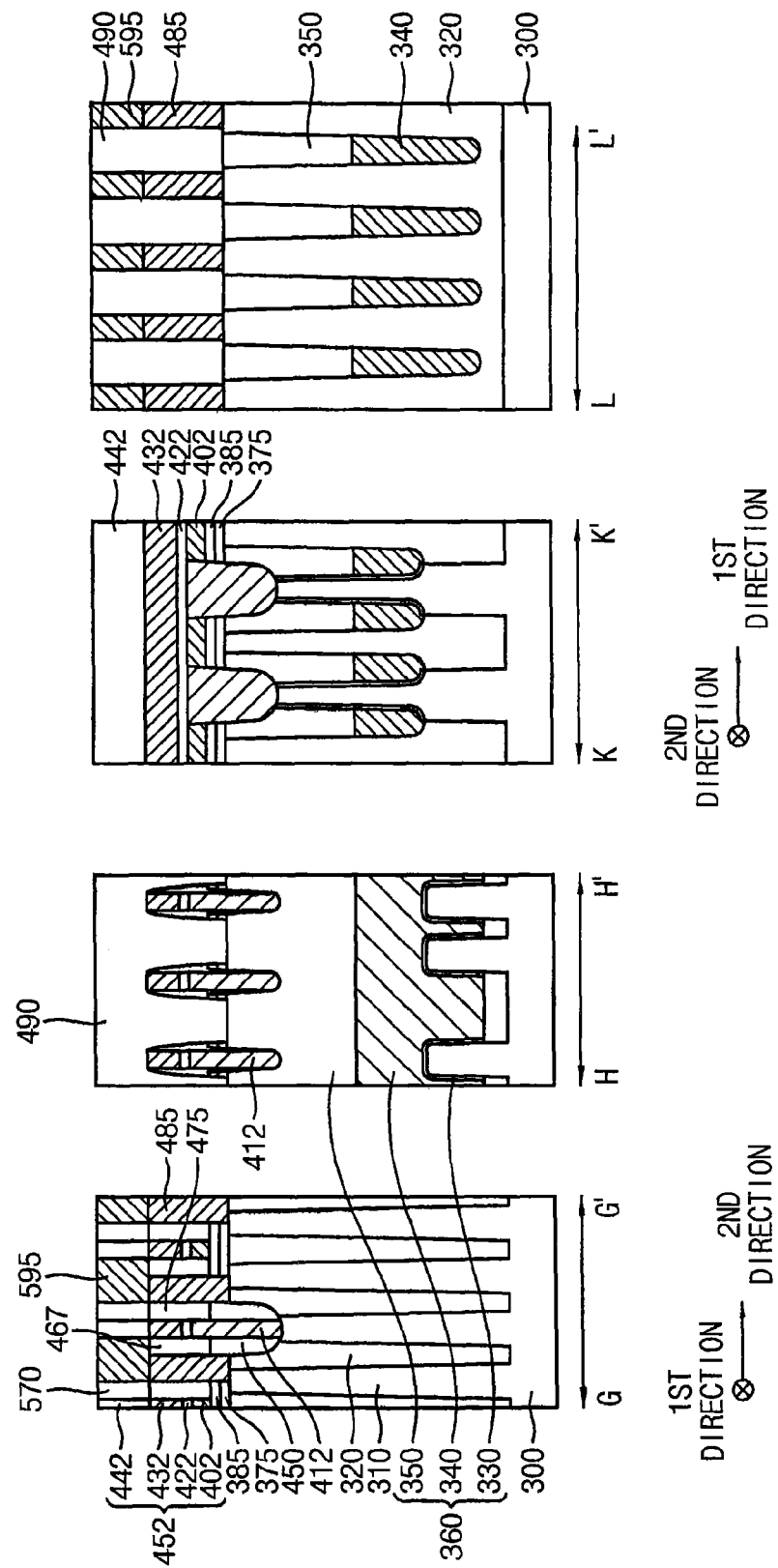

Referring to FIGS. 58 and 59, processes substantially the same as or similar to those illustrated with reference to FIGS. 34 and 35 may be performed to sequentially form a second barrier layer and a fifth conductive layer filling the eighth and ninth trenches 580a and 580b. The second barrier layer and the fifth conductive layer may be planarized until top surfaces of the second masks 442 may be exposed by a CMP process and/or an etch back process to form a second barrier layer pattern and a fifth conductive layer pattern, respectively, and a landing pad 595 including the second barrier layer pattern and the fifth conductive layer pattern may be formed. The second barrier layer may be formed to include a metal, e.g., titanium, tantalum, etc., and/or a metal nitride, e.g., titanium nitride, tantalum nitride, etc. The fifth conductive layer may be formed to include a metal, e.g., tungsten.

Accordingly, as the eighth and ninth trenches 580a and 580b may be formed in the wave type in the first direction, the landing pads 595 may be also formed in a wave type in the first direction.

Figure 60:
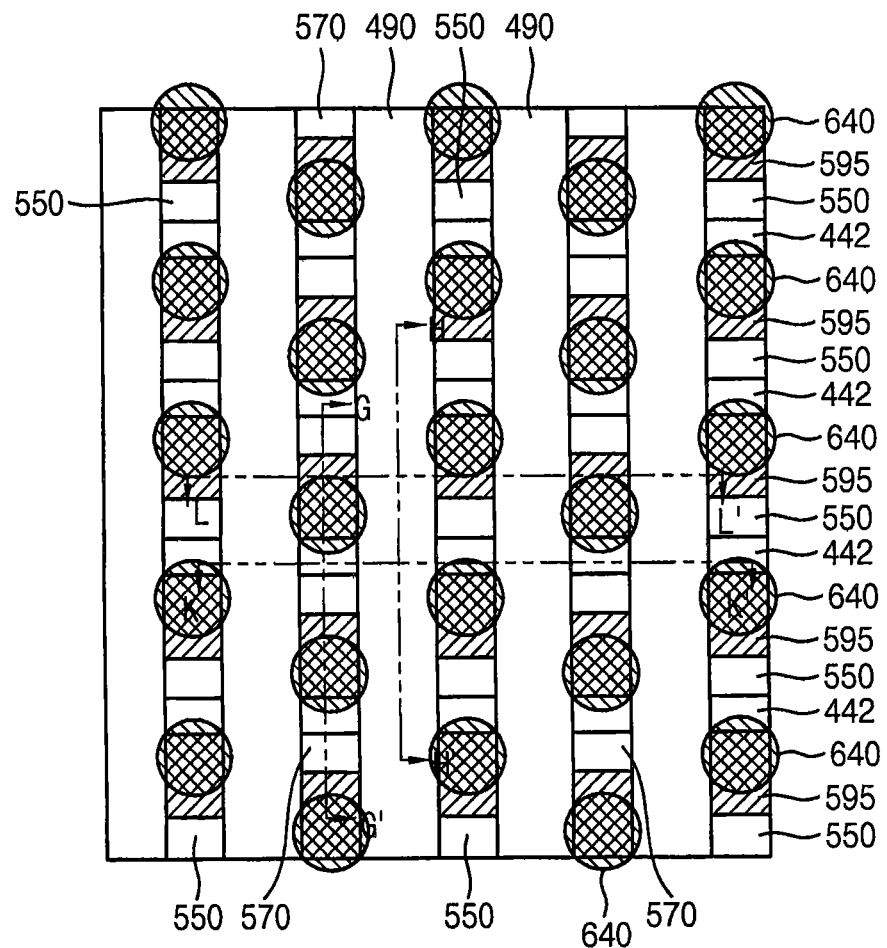
Figure 61:
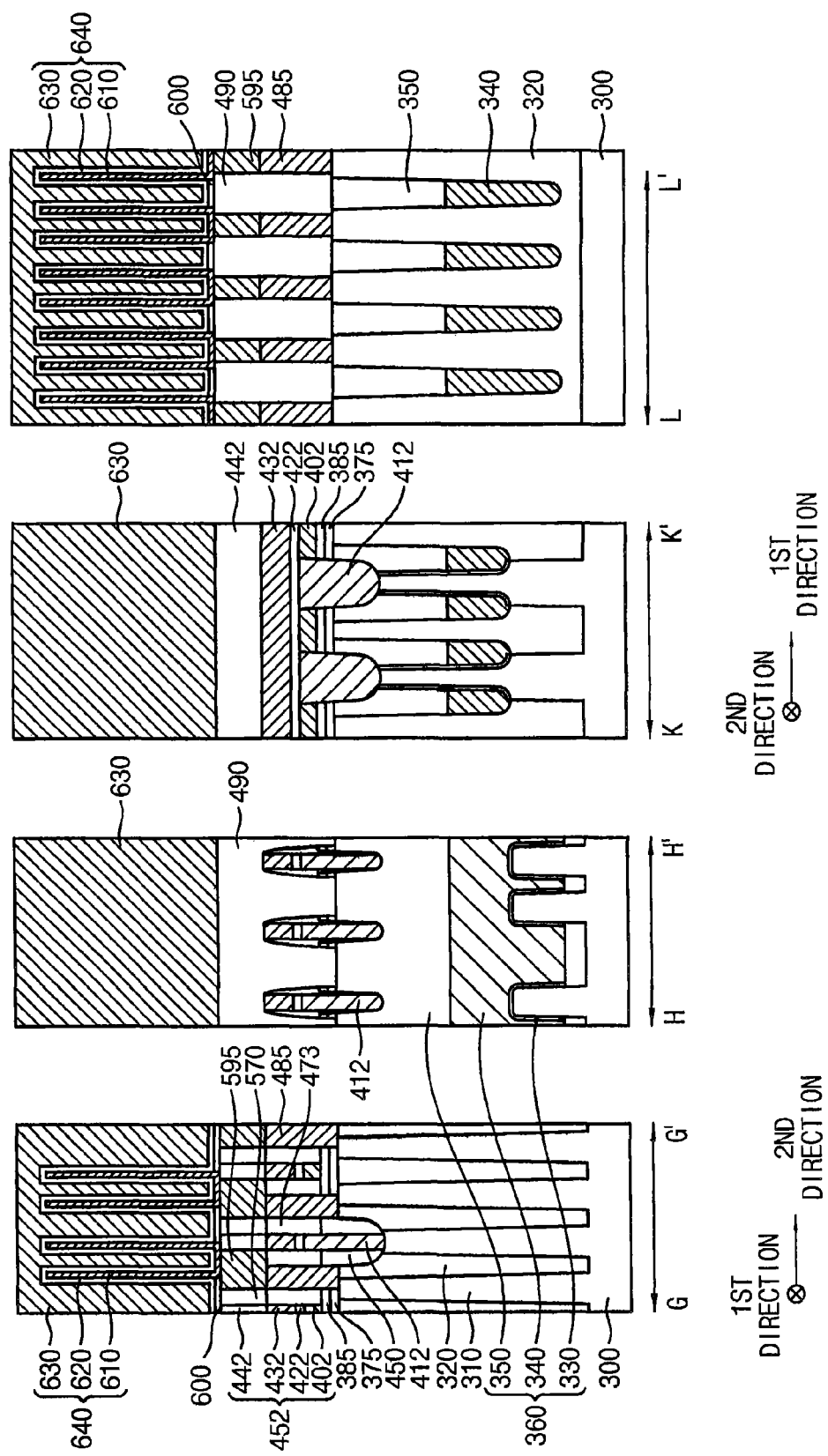

Referring to FIGS. 60 and 61, capacitors 640 contacting the landing pads 595, respectively, may be formed to complete the semiconductor device.

That is, a second etch stop layer 600 and a mold layer may be sequentially formed on the landing pads 595, the second masks 442, and the third and fourth spacers 550 and 570, and may be partially etched to form contact holes partially exposing top surfaces of the landing pads 595. A portion of the second mask 442 may be also exposed.

After a lower electrode layer may be formed on sidewalls of the contact holes, the exposed top surfaces of the landing pads 595 and the mold layer, a sacrificial layer may be formed on the lower electrode layer to sufficiently fill remaining portions of the contact holes, and upper portions of the sacrificial layer and the lower electrode layer may be planarized until a top surface of the mold layer may be exposed to divide the lower electrode layer into a plurality of pieces. The sacrificial layer and the mold layer may be removed by, e.g., a wet etch process. Thus, a plurality of cylindrical lower electrodes 610 may be formed on the sidewalls of the contact holes and the exposed top surfaces of the landing pads 595. Alternatively, a plurality of pillar-shaped lower electrode 610 filling the contact holes may be formed.

A dielectric layer 620 may be formed on the lower electrodes 610 and the second etch stop layer 600, and an upper electrode 630 may be formed on the dielectric layer 620 to form the capacitors 640 each of which may include the lower electrode 610, the dielectric layer 620 and the upper electrode 630.

In example embodiments, the lower and upper electrodes 610 and 630 may be formed to include doped polysilicon, a metal, a metal nitride, etc., and the dielectric layer 620 may be formed to include an oxide, e.g., metal oxide, silicon oxide, etc., and/or a nitride, e.g., metal nitride, silicon nitride, etc. The metal may include, e.g., aluminum, zirconium, titanium, hafnium, etc.

As illustrated above, spacer patterns having different etching rates may be formed to easily form the landing pads 595 disposed in a wave type.

The present inventive concept may be applied to various types of semiconductor devices including pattern structures, e.g., pads, masks, wirings, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed:

1. A method of forming patterns, the method comprising:
   forming first lines on a substrate, each of the first lines extending in a first direction;
   forming first and second spacers on respective opposing sidewalls of each of the first lines;
   forming second lines between respective ones of the first lines, each of the second lines extending in the first direction;
   forming division lines through at least upper portions of the first and second lines and the first and second spacers to divide an upper portion of each of the first spacers into a plurality of first spacer patterns disposed in the first direction, and divide an upper portion of each of the second spacers into a plurality of second spacer patterns disposed in the first direction, each of the division lines extending in a second direction substantially perpendicular to the first direction;
   replacing ones of the first and second spacer patterns in a zigzag pattern with third and fourth spacer patterns, respectively;
   removing upper portions of the first and second spacer patterns not replaced with the third and fourth spacer patterns and upper portions of the second lines adjacent thereto to form first trenches; and
   forming patterns to fill the first trenches.

2. The method of claim 1, wherein the first and second spacers include silicon oxide, and the third and fourth spacer patterns include silicon nitride.

3. The method of claim 1, wherein each of the first lines includes a first conductive layer pattern, a second conductive layer pattern and a hard mask sequentially stacked on the substrate, and each of the second lines includes a conductive material.

4. The method of claim 3, wherein the first conductive layer pattern and the second lines each include doped polysilicon, and the second conductive layer pattern includes a metal.

5. The method of claim 4, wherein forming division lines through at least upper portions of the first and second lines and the first and second spacers comprises forming each of the division lines through the hard mask of each of the first lines and the second lines to form an upper portion of the first lines to include a plurality of hard mask patterns disposed in the first direction, and to form a plurality of second line patterns disposed in the first direction.

6. The method of claim 1, wherein the patterns in the first trenches are formed in a wave pattern in the first direction.

7. The method of claim 1, wherein replacing ones of the first and second spacer patterns in a zigzag pattern with the third and fourth spacer patterns, respectively, comprises replacing upper portions of the ones of the first and second spacer patterns with the third and fourth spacer patterns, respectively.

8. The method of claim 7, wherein replacing the upper portions of the ones of the first and second spacer patterns with the third and fourth spacer patterns, respectively, includes:
   forming first masks to cover the first lines and the first spacer patterns;
   etching the upper portions of the second spacer patterns using the first masks as an etching mask to form second trenches; and
   forming the fifth spacer patterns to fill the second trenches, respectively.

9. The method of claim 8, wherein the fifth spacer patterns include a material having a high etching selectivity with respect to the first spacer patterns.

10. The method of claim 8, wherein each of the fifth spacer patterns includes a SOH layer pattern and a PE-SiON layer pattern sequentially stacked.

11. The method of claim 8, wherein each of the first masks extends in the first direction.

12. The method of claim 8, after forming the fifth spacer patterns, further comprising:
   forming second masks to cover the first spacer patterns in an odd-numbered row in the first direction;
   etching upper portions of the first spacer patterns using the second masks as an etching mask to form third trenches; and
   forming third spacer patterns to fill the third trenches, respectively.

13. The method of claim 12, wherein each of the second masks is formed to extend and cover the first spacer patterns in the odd-numbered row, and cover portions of the first lines, the fifth spacer patterns, and portions of the second lines that are adjacent to the first spacer patterns in the odd-numbered row in the second direction.

14. The method of claim 1, wherein forming first and second spacers on respective opposing sidewalls of each of the first lines comprises performing an exposure process using KrF, ArF, EUV or X-ray.

* * * * *